(12) United States Patent
Juliano

(10) Patent No.: US 7,659,197 B1
(45) Date of Patent: Feb. 9, 2010

(54) SELECTIVE RESPUTTERING OF METAL SEED LAYERS

(75) Inventor: Daniel R. Juliano, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 68 days.

(21) Appl. No.: 11/903,487

(22) Filed: Sep. 21, 2007

(51) Int. Cl.
*H01L 21/44* (2006.01)

(52) U.S. Cl. .................. 438/652; 438/687; 438/622; 257/E21.584; 204/298.01

(58) Field of Classification Search .......... 438/584, 438/597, 607, 652, 653, 687, 622; 257/E21.584; 204/298.01
See application file for complete search history.

(56) References Cited

U.S. PATENT DOCUMENTS

| | | | |
|---|---|---|---|
| 4,058,430 A | 11/1977 | Suntola et al. |
| 4,492,620 A | 1/1985 | Matsuo et al. |
| 4,588,490 A | 5/1986 | Cuomo et al. |
| 4,609,903 A | 9/1986 | Toyokura et al. |
| 4,622,121 A | 11/1986 | Wegmann et al. |
| 4,737,384 A | 4/1988 | Murthy et al. |
| 4,874,493 A | 10/1989 | Pan |
| 4,999,096 A | 3/1991 | Nihei et al. |
| 5,009,963 A | 4/1991 | Ohmi et al. |
| 5,084,412 A | 1/1992 | Nakasaki |
| 5,139,825 A | 8/1992 | Gordon et al. |
| 5,178,739 A | 1/1993 | Barnes et al. |
| 5,194,398 A | 3/1993 | Miyachi et al. |
| 5,221,449 A | 6/1993 | Colgan et al. |
| 5,281,485 A | 1/1994 | Colgan et al. |
| 5,298,091 A | 3/1994 | Edwards, III et al. |

(Continued)

FOREIGN PATENT DOCUMENTS

EP        0 692 551 A1       1/1996

(Continued)

OTHER PUBLICATIONS

Ding et al., "Observation of Reduced Oxidation Rates for Plasma-Assisted CVD Copper Films", Mat. Res. Soc. Symp. Proc., vol. 309, 1993 pp. 445-460.

(Continued)

*Primary Examiner*—Zandra Smith
*Assistant Examiner*—Christy L Novacek
(74) *Attorney, Agent, or Firm*—Weaver Austin Villeneuve & Sampson LLP

(57) ABSTRACT

Metal seed layers are deposited on a semiconductor substrate having recessed features by a method that involves depositing a first portion of seed layer material, subsequently selectively resputtering the deposited seed layer material in the presence of exposed diffusion barrier material, and, depositing a second portion of the seed layer material. Resputtering operation improves seed layer coverage on the recessed feature sidewalls by redistributing seed layer material within the feature. Resputtering, however, sometimes exposes an underlying diffusion barrier material at the feature bottom and at the top corners of the feature. In order to prevent inadvertent removal of diffusion barrier layer, resputtering is performed under conditions that allow etching of the seed layer material at a rate which is at least five times greater than the etching rate of a diffusion barrier material. Selective resputtering is performed by impinging on the wafer substrate with low-energy argon and/or copper ions.

32 Claims, 14 Drawing Sheets

U.S. PATENT DOCUMENTS

| | | | |
|---|---|---|---|
| 5,378,506 A | 1/1995 | Imai et al. | |
| 5,482,611 A | 1/1996 | Helmer et al. | |
| 5,622,608 A | 4/1997 | Lanford et al. | |
| 5,629,221 A | 5/1997 | Chao et al. | |
| 5,654,233 A | 8/1997 | Yu | |
| 5,656,860 A | 8/1997 | Lee | |
| 5,766,379 A | 6/1998 | Lanford et al. | |
| 5,789,027 A | 8/1998 | Watkins et al. | |
| 5,801,089 A | 9/1998 | Kenney | |
| 5,904,565 A | 5/1999 | Nguyen et al. | |
| 5,969,422 A | 10/1999 | Ting et al. | |
| 5,985,762 A | 11/1999 | Geffken et al. | |
| 6,037,257 A | 3/2000 | Chiang et al. | |
| 6,046,108 A | 4/2000 | Liu et al. | |
| 6,074,544 A | 6/2000 | Reid et al. | |
| 6,077,780 A | 6/2000 | Dubin | |
| 6,080,285 A | 6/2000 | Liu et al. | |
| 6,093,966 A | 7/2000 | Venkatraman et al. | |
| 6,099,702 A | 8/2000 | Reid et al. | |
| 6,100,200 A | 8/2000 | Van Buskirk et al. | |
| 6,110,346 A | 8/2000 | Reid et al. | |
| 6,114,238 A | 9/2000 | Liao | |
| 6,120,641 A | 9/2000 | Stevens et al. | |
| 6,124,203 A | 9/2000 | Joo et al. | |
| 6,126,798 A | 10/2000 | Reid et al. | |
| 6,139,712 A | 10/2000 | Patton et al. | |
| 6,147,000 A | 11/2000 | You et al. | |
| 6,156,167 A | 12/2000 | Patton et al. | |
| 6,159,354 A | 12/2000 | Contolini et al. | |
| 6,159,857 A | 12/2000 | Liu et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,200,893 B1 | 3/2001 | Sneh | |
| 6,203,613 B1 | 3/2001 | Gates et al. | |
| 6,217,716 B1 | 4/2001 | Fai Lai | |
| 6,221,757 B1 | 4/2001 | Schmidbauer et al. | |
| 6,228,754 B1 | 5/2001 | Iacoponi et al. | |
| 6,235,163 B1 | 5/2001 | Angelo et al. | |
| 6,249,055 B1 | 6/2001 | Dubin | |
| 6,251,242 B1 | 6/2001 | Fu et al. | |
| 6,271,591 B1 | 8/2001 | Dubin et al. | |
| 6,274,008 B1 | 8/2001 | Gopalraja et al. | |
| 6,277,249 B1 | 8/2001 | Gopalraja et al. | |
| 6,280,597 B1 | 8/2001 | Kashiwada et al. | |
| 6,287,977 B1 | 9/2001 | Hashim et al. | |
| 6,333,547 B1 | 12/2001 | Tanaka et al. | |
| 6,340,435 B1 | 1/2002 | Bjorkman et al. | |
| 6,342,133 B2 | 1/2002 | D'Couto et al. | |
| 6,342,448 B1 | 1/2002 | Lin et al. | |
| 6,350,353 B2 | 2/2002 | Gopalraja et al. | |
| 6,387,805 B2 | 5/2002 | Ding et al. | |
| 6,391,785 B1 | 5/2002 | Satta et al. | |
| 6,395,642 B1 | 5/2002 | Liu et al. | |
| 6,402,907 B1 | 6/2002 | Rich | |
| 6,417,094 B1 | 7/2002 | Zao et al. | |
| 6,440,854 B1 | 8/2002 | Rozbicki | |
| 6,448,176 B1 | 9/2002 | Grill et al. | |
| 6,451,177 B1 | 9/2002 | Gopalraja et al. | |
| 6,492,262 B2 | 12/2002 | Uzoh | |
| 6,498,091 B1 | 12/2002 | Chen et al. | |
| 6,500,762 B2 | 12/2002 | Hashim et al. | |
| 6,509,267 B1 | 1/2003 | Woo et al. | |
| 6,538,324 B1 | 3/2003 | Tagami et al. | |
| 6,541,374 B1 | 4/2003 | de Felipe et al. | |
| 6,554,914 B1 | 4/2003 | Rozbicki et al. | |
| 6,559,061 B2 | 5/2003 | Hashim et al. | |
| 6,562,715 B1 | 5/2003 | Chen et al. | |
| 6,566,246 B1 | 5/2003 | de Felipe et al. | |
| 6,589,887 B1 | 7/2003 | Dalton et al. | |
| 6,605,534 B1 | 8/2003 | Chung et al. | |
| 6,607,977 B1 * | 8/2003 | Rozbicki et al. | 438/627 |
| 6,607,982 B1 | 8/2003 | Powell et al. | |
| 6,613,199 B1 | 9/2003 | Tobin et al. | |
| 6,642,146 B1 | 11/2003 | Rozbicki et al. | |
| 6,652,718 B1 | 11/2003 | D'Couto et al. | |
| 6,656,841 B1 | 12/2003 | Kim | |
| 6,660,622 B2 | 12/2003 | Chen et al. | |
| 6,673,716 B1 | 1/2004 | D'Couto et al. | |
| 6,706,155 B2 | 3/2004 | Morimoto et al. | |
| 6,709,987 B2 | 3/2004 | Hashim et al. | |
| 6,755,945 B2 | 6/2004 | Yasar et al. | |
| 6,764,940 B1 | 6/2004 | Rozbicki et al. | |
| 6,758,947 B2 | 7/2004 | Chiang et al. | |
| 6,784,096 B2 | 8/2004 | Chen et al. | |
| 6,790,776 B2 | 9/2004 | Ding et al. | |
| 6,841,044 B1 | 1/2005 | Ruzic | |
| 6,893,541 B2 * | 5/2005 | Chiang et al. | 204/192.17 |
| 6,905,965 B2 | 6/2005 | Subrahmanyan et al. | |
| 6,919,275 B2 | 7/2005 | Chiang et al. | |
| 6,943,111 B2 | 9/2005 | Lin et al. | |
| 6,949,457 B1 | 9/2005 | Fiordalice et al. | |
| 6,969,448 B1 | 11/2005 | Lau | |
| 6,992,012 B2 | 1/2006 | Hashim et al. | |
| 7,030,031 B2 | 4/2006 | Wille et al. | |
| 7,037,830 B1 | 5/2006 | Rumer et al. | |
| 7,048,837 B2 | 5/2006 | Somekh et al. | |
| 7,074,714 B2 | 7/2006 | Chiang et al. | |
| 7,135,402 B2 | 11/2006 | Lin et al. | |
| 7,186,648 B1 | 3/2007 | Rozbicki et al. | |
| 7,253,109 B2 | 8/2007 | Ding et al. | |
| 7,294,574 B2 | 11/2007 | Ding et al. | |
| 7,365,001 B2 | 4/2008 | Yang et al. | |
| 2002/0000382 A1 | 1/2002 | Morrissey et al. | |
| 2002/0041028 A1 | 4/2002 | Choi et al. | |
| 2002/0110999 A1 * | 8/2002 | Lu et al. | 438/584 |
| 2003/0034244 A1 | 2/2003 | Yasar et al. | |
| 2003/0116427 A1 | 6/2003 | Ding et al. | |
| 2003/0129828 A1 | 7/2003 | Cohen | |
| 2004/0048461 A1 | 3/2004 | Chen et al. | |
| 2004/0171250 A1 | 9/2004 | Chiang et al. | |
| 2004/0188239 A1 | 9/2004 | Robison et al. | |
| 2004/0211661 A1 | 10/2004 | Zhang et al. | |
| 2005/0006222 A1 | 1/2005 | Ding et al. | |
| 2005/0020080 A1 | 1/2005 | Chiang et al. | |
| 2005/0032382 A1 * | 2/2005 | Rossman | 438/695 |
| 2005/0085068 A1 | 4/2005 | Chiang et al. | |
| 2005/0173239 A1 | 8/2005 | Somekh et al. | |
| 2005/0211545 A1 | 9/2005 | Cerio, Jr. et al. | |
| 2005/0252765 A1 | 11/2005 | Zhang et al. | |
| 2005/0255690 A1 | 11/2005 | Chen et al. | |
| 2005/0255691 A1 | 11/2005 | Ding et al. | |
| 2005/0266682 A1 | 12/2005 | Chen et al. | |
| 2005/0272254 A1 | 12/2005 | Ding et al. | |
| 2006/0014378 A1 | 1/2006 | Aggrawal et al. | |
| 2006/0024953 A1 | 2/2006 | Rao et al. | |
| 2006/0030151 A1 | 2/2006 | Ding et al. | |
| 2006/0057843 A1 | 3/2006 | Chen et al. | |
| 2006/0207873 A1 | 9/2006 | Fu | |
| 2007/0178682 A1 * | 8/2007 | Chiang et al. | 438/584 |
| 2008/0190760 A1 | 8/2008 | Tang et al. | |
| 2008/0310005 A1 * | 12/2008 | Tonar et al. | 359/265 |

FOREIGN PATENT DOCUMENTS

JP            11-186273          9/1999

OTHER PUBLICATIONS

Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.

M. Zinke-Allmang, "Phase Separation on Solid Surfaces: Nucleation, Coarsening and Coalescence Kinetics".

Peijun Ding, et al., "Copper Barrier, Seed Layer and Planarization Technologies," VMIC Conference, Jun. 10-12, 1997, pp. 87-92.

Tarek Suwwan de Felipe, et al., "Electrical Stability and Microstructual Evolution in Thin Films of High Conductivity Copper Alloys," IEEE, Jun. 1999, pp. 293-295.

Cho et al., "Factors Affecting Passivation and Resistivity of Cu(Mg) Alloy Film," Materials Research Society Symposium Proc. vol. 564, 1999, pp. 353-358.

Murarka et al., "Copper Metallization for ULSI and Beyond," Critical Reviews in Solid State and Materials Sciences, 1995, pp. 87-124.

Braeckelmann et al. "Integration and Reliability of Copper Magnesium Alloys for Multilevel Interconnects," IEEE, Feb. 2000, pp. 236-238.

Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.

Ding et al., "Effects of the addition of small amounts of Al to copper: Corrosion, resistivity, adhesion, morphology, and diffusion," J. Appl. Phys. 75(7), Apr. 1994, pp. 3627-3631.

T. Suwwan de Felipe et al., "Bias-temperature stability of the $Cu(Mg)/SiO_2/p$-Si metal-oxide-semiconductor capacitors," J. Vac. Sci. Technol. B 15(6), Nov./Dec. 1997, pp. 1987-1986.

Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.

Cho et al., "Remote Plasma-Assisted Metal Organic Chemical Vapor Deposition of Tantalum Nitride Thin Films with Different Radicals," Dec. 1998, Jpn. J. Appl. Phys., vol. 37.

Endle et al., "X-Ray Photoelectron Spectroscopy Study on TiN Films Produced with Tetralcis (dimethylamido)Titanium and Selected N-Containing Precursors on $SiO_2$," May/Jun. 1998, J. Vac. Sci. Technol., A 16(3), pp. 1262-1267.

Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.

Han et al., "Barrier Metal Properties of Amorphous Tantalum Nitride Thin Films Between Platnium and Silicon Deposited Using Remote Plasma Metal Organic Chemical Vapor Method," May 1998, Jpn. J. Appl. Phys., vol. 37 (1998), Pt. 1, No. 5A, pp. 2646-2651.

Schumacher Products, TDEAT (Tetrakis-diethylamino Titanium), Electronic Grade, www.schumacher.com/tdeat.html, printed Jun. 5, 2001, 1 page.

Sun et al., Suppression of Cobalt Silicide Agglomeration Using Nitrogen (N2+) Implantation, IEEE Electron Device Letters, vol. 19, No. 5, May 1998, pp. 163-166.

Ashanti et al., "A New Hollow-Cathode Magnetron Source for 0.10. mu.m Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnect", Jun. 16-18, 1998, VMIC Conference, pp. 91 and 93.

Jian Li and J. W. Mayer and E. G. Colgan, "Oxidation and Protection in Copper and Copper Alloy Thin Films", J. Appl. Phys. 70 (5), Sep. 1, 1991, pp. 2820-2827.

Hayden et al., "Characterization of Magnetron-Sputtered Partially Ionized Aluminum Deposition," Mar./Apr. 1998, J. Vac. Sci. Technol., A 16(2), pp. 624-627.

Hayden et al., "Helion Plasma Source for Ionized Physical Vapor Deposition," 1999, Surface and Coatings Technology, 120-121 (1999), pp. 401-404.

Lee et al., "The Failure Mechanism of MOCVD TiN Diffusion Barrier at High Temperature," 1996, Mat. Res. Soc. Symp. Proc., vol. 324, pp. 279-284.

Lucovslcy et al., "Formation of Thin Fims by Remote Plasma Enhanced Chemical Vapor Deposition (Remote PECVD)," Feb. 1990, in Handbook of Plasma Processing Technology, eds. Rossnagel, Cuomo and Westwood, Noyes Publications, pp. 387-408.

Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.

Peng et al., "Structural and Electrical Properties of Chemical Vapor Deposition Tungsten Overgrowth on Physical Vapor Deposited and Metalorganic Chemical Vapor Deposited TiN Adhesion Layers," Jul./Aug. 1998, J. Vac. Sci. Technol., B 16(4), pp. 2013-2018.

Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, J. Phys. Chem., 1995, 99, pp. 8831-8842.

Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.

Danek et al., "Barrier First Method for Single Damascene Trench Applications," Novellus Systems, Inc., U.S. Appl. No. 11/714,465, filed Mar. 5, 2007.

U.S. Office Action mailed Jul. 31, 2002, from U.S. Appl. No. 09/862,539.

U.S. Office Action mailed Sep. 16, 2002, from U.S. Appl. No. 09/776,704.

U.S. Office Action mailed Apr. 22, 2002, from U.S. Appl. No. 09/776,704.

U.S. Final Office Action mailed Apr. 3, 2003, from U.S. Appl. No. 09/816,847.

U.S. Office Action mailed Oct. 4, 2002, from U.S. Appl. No. 09/816,847.

U.S. Office Action mailed Oct. 23, 2002, from U.S. Appl. No. 09/965,472.

U.S. Office Action mailed Oct. 3, 2003, from U.S. Appl. No. 10/412,562.

U.S. Final Office Action mailed Mar. 23, 2006, from U.S. Appl. No. 10/804,353.

U.S. Office Action mailed Oct. 3, 2006, from U.S. Appl. No. 10/804,353.

U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Klawuhn et al., "Apparatus and Methods for Deposition and/or Etch Selectivity," Novellus Systems, Inc., U.S. Appl. No. 11/558,693, filed Nov. 10, 2006.

Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.

Dulkin et al., "Method and Apparatus for Controlling Sputtered Flux in PVD Sources," Novellus Systems, Inc., U.S. Appl. No. 11/564,222, filed Nov. 28, 2006.

Kailasam et al., "Resputtering Process for Eliminating Dielectric Damage," Novellus Systems, Inc., U.S. Appl. No. 11/588,586, filed Oct. 26, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki, R., "Methods and Apparatus for Resputtering Process that Improves Barrier Coverage," Novellus Systems, Inc., U.S. Appl. No. 11/830,777, filed Jul. 30, 2007.

Rozbicki et al., "Multistep Method of Depositing Metal Seed Layers," Novellus Systems, Inc., U.S. Appl. No. 11/701,984, filed Feb. 1, 2007.

Pradhan et al., "Atomic Layer Profiling of Diffusion Barrier and Metal See Layers," Novellus Systems, Inc., U.S. Appl. No. 11/807,179, filed May 24, 2007.

Vijayendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during Cl$_2$ and HBr plasma etching of silicon," J.Vac. Sci. Technol. B 18(2), Mar./Apr. 2000, pp. 820-833.

Hoekstra et al., "Microtenching resulting from specular reflection during chlorine etching of silicon," J.Vac. Sci. Technol. B 16(4), Jul./Aug. 1998, pp. 2102-2104.

Lane et al., "Feature evolution during plasma etching. II. Polycrystalline silicone etching," J.Vac. Sci. Technol. A 18(1), Jan./Feb. 2000, pp. 188-196.

Rozbicki R., "A Method of Enhancing Selectivity of Resputtering Process," Novellus Systems, Inc., U.S. Appl. No. 11/977,355, filed Oct. 23, 2007.

Pradhan et al., "Method and Apparatus for Increasing Local Plasma Density in Magnetically Confined Plasma," Novellus Systems, Inc., U.S. Appl. No. 11/806,182, filed May 24, 2007.

Kinder et al., "The Use of Ultra-High Magnetic Fields in Resputter and Plasma Etching," Novellus Systems, Inc., U.S. Appl. No. 11/807,183, filed May 24, 2007.

Dullcin et al., "Methods and Apparatus for Engineering and Interface Between A Diffusion Barrier Layer and A Seed Layer," Novellus Systems, Inc., U.S. Appl. No. 11/807,178, filed May 24, 2007.

U.S. Office Action mailed on Feb. 23, 2009 for U.S. Appl. No. 11/701,984.

U.S. Office Action mailed Mar. 24, 2009 for U.S. Appl. No. 11/473,618.

U.S. Office Action mailed on May 5, 2009 for U.S. Appl. No. 11/588,586.

Wu et al., "Deposition of Doped Copper Seed Layers Having Improved Reliability," Novellus Systems, Inc., U.S. Appl. No. 12/122,118, filed May 16, 2008.

U.S. Office Action mailed Jun. 26, 2008, from U.S. Appl. No. 11/473,618.

U.S. Office Action mailed May 2, 2008, from U.S. Appl. No. 11/558,693.

U.S. Office Action mailed Dec. 12, 2008, from U.S. Appl. No. 11/714,465.

Notice of Allowance and Fee Due mailed Nov. 24, 2008, from U.S Appl. No. 11/558,693.

U.S. Final Office Action mailed Dec. 10, 2008, from U.S. Appl. No. 11/473,618.

U.S. Office Action mailed Nov. 14, 2008, from U.S. Appl. No. 11/701,984.

Notice of Allowance and Fee Due mailed Apr. 13, 2004, from U.S Appl. No. 10/412,562.

Notice of Allowance and Fee Due mailed Oct. 3, 2006, from U.S. Appl. No. 10/804,353.

Wu et al., "Methods and Apparatus for Depositing Titanium Based Diffusion Barrier Films," Novellus Systems, Inc., U.S. Appl. No. 12/154,984, filed May 28, 2008.

\* cited by examiner

SELECTIVE RESPUTTERING OF METAL SEED LAYERS

FIELD OF THE INVENTION

The present invention pertains to methods of depositing layers of material on a partially fabricated integrated circuit. The methods are particularly useful for depositing metal seed layers, such as copper seed layers in Damascene processing.

BACKGROUND OF THE INVENTION

Damascene processing is a method for forming metal lines on integrated circuits. It involves formation of inlaid metal lines in trenches and vias formed in a dielectric layer (inter metal dielectric). Damascene processing is often a preferred method because it requires fewer processing steps than other methods and offers a higher yield. It is also particularly well-suited to metals such as copper that cannot be readily patterned by plasma etching.

In a typical Damascene process flow, metal (such as copper) is deposited onto a patterned dielectric to fill the vias and trenches formed in the dielectric layer. The resulting metallization layer is typically formed either directly on a layer carrying active devices or on another metallization layer. A stack of several metallization layers can be formed using Damascene processing. The metal-filled lines of this stack serve as conducting paths of an integrated circuit.

Before the metal is deposited into the vias and trenches of the patterned dielectric, the dielectric layer is lined with a thin layer of diffusion barrier material (e.g., Ta, $TaN_x$, or $Ta/TaN_x$ bi-layer), and, subsequently, with a thin layer of seed layer material (e.g., Cu or Al). The diffusion barrier layer protects inter-metal dielectric (IMD) and active devices from diffusion of copper and other readily diffusing metals into these regions. The seed layer facilitates deposition of metal into the vias and trenches. For example, when electrofill methods are used for copper deposition, a copper seed layer is pre-deposited over the surface of the wafer. The copper seed layer serves as a cathode to which electrical contact is made during copper electrofill operation.

Continuous and conformal seed layers that follow the profile of the recessed features on the wafer without forming excessively thin or thick regions are highly desired. As the dimensions of the recessed features are decreasing, deposition of conformal seed layers becomes more challenging. Typically, seed layer material is deposited by physical vapor deposition (PVD) methods. In these methods neutral and/or ionized metal is sputtered from the metal target onto the wafer substrate. The neutral metal flux arrives at the wafer from all directions, and due to its non-directional nature a large portion of neutral metal flux is deposited at feature openings, often leading to formation of overhangs. The ionized metal flux is deposited more selectively on horizontal surfaces of the wafer (e.g., in the field region and in the feature bottoms) due to its greater directionality. The wafer substrate is often negatively self-biased (or may be externally biased) causing the positive metal ions to arrive at the wafer surface close to a 90° angle and to deposit predominantly on horizontal surfaces. While good coverage on horizontal surfaces can be obtained with the use of ionized metal flux, continuous conformal sidewall coverage is difficult to obtain by sputter deposition methods. Inadequate sidewall coverage, particularly in high aspect ratio features, is often observed with conventional PVD methods.

One technique which can improve sidewall coverage is resputter, also known as sputter etch. During resputter, energetic ions impinge on the exposed material on a substrate with sufficient momentum to remove the material from the substrate. The resputtered material may be permanently removed from the wafer (etched) or may be redistributed within the recessed feature. For example, seed layer material may be etched from the feature bottom and may be redeposited onto the feature sidewall. Resputtering can be performed in a plasma PVD chamber by adjusting the energy of the ions impinging on a wafer. Resputtering involves net removal of material from at least one region on the substrate, e.g., from the bottom of a recessed feature. Resputtering can be used to remove seed layer material from excessively thick regions and to improve coverage in excessively thin regions.

While resputtering is an attractive method for achieving conformal seed layer coverage, it is noted that aggressive seed layer sputter etching may involve exposing diffusion barrier material which underlies the seed layer, and, can inadvertently remove it. Such removal of diffusion barrier material is undesirable and should be, if possible, avoided. Removal of diffusion barrier layer can lead to excessively thin diffusion barrier layers, or, in the worst case, dielectric may be exposed and may be contaminated with conductive seed layer material. Therefore, methods for selective sputter etching of seed layer material in the presence of diffusion barrier material are needed.

Several methods for selective resputtering were described in US Patent application publication No. 2006/0030151 by Ding at al., published on Feb. 9, 2006. These methods are based on performing resputtering with light (low atomic weight) inert gas ions, particularly with helium ions. Helium inert gas is introduced into the PVD process chamber and is ionized in a plasma. When light inert gas ions strike the substrate surface, they are capable of selectively sputter etching copper seed layer in the presence of exposed tantalum diffusion barrier. Therefore, with light ion resputtering, seed layer material is removed or redistributed without significantly removing the diffusion barrier material.

Light ion resputtering, however, has several disadvantages, which include high cost of light inert gases (e.g., He), the necessity of PVD apparatus modification to accommodate delivery of light inert gases into the process chamber, and, the necessity of a particular apparatus configuration which allows generation of light inert gas ions without generating substantial amounts of heavier metal ions.

New methods for selective resputtering of seed layers are needed.

SUMMARY OF THE INVENTION

The present invention addresses this need by providing a new method for selective sputter etching of seed layer materials in the presence of exposed diffusion barrier materials. The diffusion barrier material typically becomes exposed during the resputtering process and does not necessarily need to be exposed before the process is initiated. Selective resputtering is performed by impinging on the substrate surface with relatively heavy ions and/or neutral atoms having low energy. For example, selective resputtering occurs when argon and/or copper ions having energies of less than about 200 eV impinge on the substrate surface. Under these conditions, copper-containing seed layers are etched at least about five times faster than tantalum-containing diffusion barrier materials. The ratio of seed layer etch rate to the diffusion barrier etch rate is herein referred to as etch selectivity. Typically, selectivities of at least about 4, preferably at least about 5 are desired.

While Ding et al. show that low energy resputtering is more selective than high energy resputtering, Ding et al. explicitly demonstrate that this effect is limited to resputtering with light ions, such as helium. According to Ding, resputtering with heavier ions, such as argon ions, does not provide selectivities of greater than about 2 over a large range of ion energies, including energies lower than about 200 eV.

It was surprisingly discovered that contrary to Ding's calculations, sputter etch selectivities for ions heavier than helium ions, e.g. for ions having a molecular weight of at least about 40, such as for argon and copper ions, dramatically increase at lower ion energies. Selectivities of at least about 5, and, in some cases, at least about 8 can be obtained for low energy resputtering with argon and/or copper plasma. Advantageously, selective resputtering with heavy ions does not require modifications to the apparatus hardware. Specifically, because argon is the most common working sputter gas, no additional delivery lines are necessary in those embodiments where argon is used for selective resputtering. Further, selective resputtering can be performed with mixtures of metal ions and inert gas ions, and does not require any special PVD apparatus configuration, that would decouple generation of inert gas ions and metal ions. Provided methods can be practiced in PVD chambers with no modifications to hardware by adjusting process parameters, e.g., power levels provided to the wafer and to the target, such that the desired levels of energy are obtained.

According to one aspect, a method for depositing a seed layer material (e.g., copper, aluminum, or silver) on a wafer substrate having recessed features is provided. The seed layer material is deposited over diffusion barrier material, which may include Ta, $TaN_x$, Ti, $TiN_x$, Ru, Co, W etc. The method can be applied for depositing seed layers in contact holes and interconnects, e.g., in Damascene structures. The method involves depositing a first portion of the seed layer material over the surface of the substrate (typically at least in the field region, in the feature bottoms and on the top corners of recessed features) and subsequently selectively sputter etching a portion of the seed layer material in a presence of an exposed diffusion barrier material such that a rate of seed layer material etching is at least about five times greater than a rate of diffusion barrier material etching. The selective sputter etching comprises impinging on the wafer substrate with low energy ions and/or neutral atoms, wherein the majority or substantially all of the ions or neutral atoms have a molecular weight of at least about 40 (e.g., with argon and/or copper ions). The resputtering operation may serve to redistribute seed layer material from the bottom portions of recessed features to feature sidewalls. Resputtering can also reduce overhangs which may form at recessed feature openings (top corners) during deposition. After resputtering is completed, a second portion of seed layer material is deposited over the surface of the wafer, typically to provide seed layer coverage on horizontal surfaces of the wafer, such as at feature bottoms and in the field region, as well as on the top corners of the recessed features.

Low energy selective resputtering operation may involve resputtering with argon as the major or the only species. In other embodiments, argon may be mixed with a heavier metal in various proportions. For example, resputtering with mixtures of argon ions and copper ions can be performed. In yet other embodiments, argon ions may be a major species in a mixture with a lighter metal, such as aluminum. In different embodiments, selective resputtering is performed with copper ions as the major or the only species in a resputtering plasma.

The energy of the resputtering ions is adjusted to achieve optimal selectivity at an acceptable etch rate. For example, impinging on the substrate with ions having energy on impact of less than about 200 eV, e.g., about 100 eV provides excellent Cu/Ta selectivities and good etch rates for argon-containing resputtering plasma.

Good selectivities can be obtained for sputter etching copper or copper alloys in the presence of Ta, Ti, Co, Ru, and W-containing diffusion barriers. Further, selective resputtering can be achieved for sputter etching aluminum or silver seed layer in the presence of tantalum-containing diffusion barrier.

While selective resputtering with low energy ions provides lower etch rates than non-selective resputtering with high energy ions, etch rates of at least about 2 Å/second can be achieved with low energy resputtering. Etch rates of at least about 5 Å/second can be obtained for low energy resputtering when high plasma densities (e.g., plasma densities of at least about $10^{10}$ ions/cm$^3$) are provided proximate the substrate.

In some embodiments, the seed layer deposition method involves repeating selective resputtering and seed layer deposition operations at least once to achieve optimal seed layer coverage.

In some embodiments resputtering with high energy ions is performed prior to selective low energy resputtering. Resputtering with high energy ions provides high etch rates but has lower selectivity. Thus, resputtering with high energy ions (e.g., with ions having energies of at least about 200 eV) can be performed until the diffusion barrier becomes exposed. Then, low energy selective resputtering is performed. High energy resputtering, low energy resputtering and seed layer deposition operations can be repeated at least once to obtain improved seed layer coverage. The process may end after a resputtering operation or after a deposition operation, as long as a continuous seed layer of optimal thickness has been deposited.

Low energy selective resputtering can be performed in a variety of apparatus types which allow generation of plasma. For example, it can be practiced in a plasma pre-clean chamber (without a metal target) or in a plasma PVD chamber having a planar or a three-dimensional metal target. A PVD apparatus can also include a magnetron for improved plasma confinement. In some embodiments, the methods are practiced in a hollow cathode magnetron (HCM).

In some embodiments, low energy resputtering is performed in a plasma PVD chamber equipped with a metal target using argon as a working gas. The pressure in the chamber can range from about 0.5 mTorr to about 50 mTorr. The target is negatively biased during resputter at a power level ranging from about 500 W to about 10 kW. An external RF bias may be provided to the wafer at a power level of less than about 2,000 W, preferably less than about 600 W. In some embodiments, no external bias is provided to the wafer, which acquires self-bias in the plasma PVD chamber.

In another aspect, a method of resputtering a layer of metal on a wafer substrate having a recessed feature is provided, wherein the method involves resputtering the layer of metal by impinging on it with argon and/or copper ions having an energy of less than about 200 eV, such that resputtering comprises sputter etching the layer of metal at least on one location on the wafer at a net etch rate of at least about 2 Å/second. For example, resputtering may involve redistributing the layer of metal residing at the opening of recessed feature and/or redistribution of material from the bottom of the feature to the feature sidewalls.

In another aspect, an apparatus for depositing a metal seed layer on a semiconductor wafer having recessed features and a field region is provided. The apparatus includes a process chamber having a target for sputtering a metal onto the semiconductor wafer; a wafer support for holding the wafer in position during deposition of the metal; and a controller comprising program instructions for depositing a layer of metal on the substrate. The instructions specify process parameters for sputtering the metal from the target onto the semiconductor wafer under conditions that coat at least the bottom portions of the recessed features and the field region, thereby forming a first layer of metal; subsequently selectively resputtering the first layer of metal to redistribute the metal from the bottom portions of the recessed features to the sidewalls of recessed features without substantially removing a layer of diffusion barrier material residing at the recess bottoms and/or at top corner portions of the recessed features. Instructions specify parameters for resputtering with low energy argon and/or metal ions, such that a rate of the first layer of metal etching is at least about 5 times greater than a rate of diffusion barrier material etching. The instructions further specify parameters for subsequent sputtering operation in which metal is deposited from the target onto the semiconductor wafer to form a second layer of metal.

These and other features and advantages of the present invention will be described in more detail below with reference to the associated drawings.

DETAILED DESCRIPTION OF PREFERRED EMBODIMENTS

Introduction and Overview

As it was mentioned, methods for depositing metal seed layers are herein described. These methods can be used in a variety of applications that require deposition of thin layers of metal on a substrate having recessed features. These methods are particularly suitable for IC fabrication, and will be illustrated in the context of a copper dual Damascene processing. It is understood that these methods can be used in other processing methods, including single Damascene processing, and can be applied to deposition of a variety of metals beyond copper. For example, aluminum and silver seed layers can be deposited using these methods. Further, a variety of alloys such as copper alloys with a number of alloying materials may be deposited. Examples of alloying materials include Mg, Mn, Al, Sn, Zn, Ta, Ag, and B, to name a few. In some embodiments, the alloying material is present in a copper alloy at a concentration of a few atomic percent, e.g., in the range of about 0.5-10 atomic percent. Other seed layer materials and particular alloy compositions used in seed layer applications are well known to those of skill in the art and will not be described in further detail. It is noted that "seed layers" as used herein include not only seed layers deposited prior to electrofill deposition of metals, but encompass any type of a thin conformal layer pre-deposited prior to any type of metal fill. For example, various types of nucleation layers, pre-deposited prior to PVD fill, electroless fill, CVD fill, etc., are within the scope of described seed layer deposition methods.

In order to frame the context of this invention, a brief description of a copper dual Damascene process for forming a partially fabricated integrated circuit is described below.

Figure 1A:
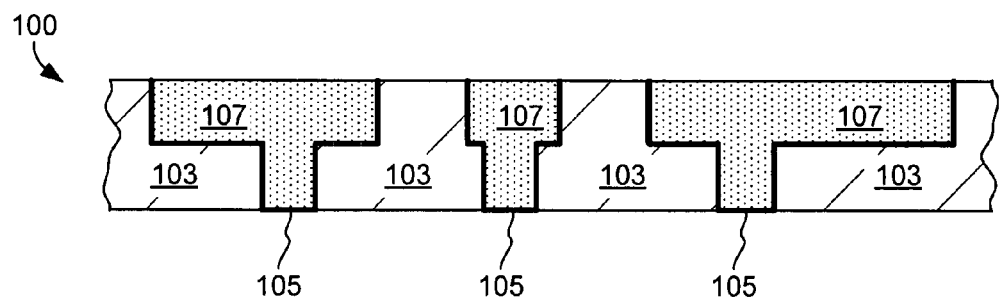
FIGS. 1A-1H show cross sectional depictions of device structures created during a copper dual Damascene fabrication process.

Presented in FIGS. 1A-1G, is a cross sectional depiction of device structures created at various stages of a dual Damascene fabrication process. A cross sectional depiction of a completed structure created by the dual Damascene process is shown in FIG. 1H. Referring to FIG. 1A, an example of a typical substrate, 100, used for dual Damascene fabrication is illustrated. Substrate 100 includes a pre-formed dielectric layer 103 (such as fluorine or carbon doped silicon dioxide or an organic-containing low-k material) with etched line paths (trenches and vias) in which a diffusion barrier 105 has been deposited followed by inlaying with copper conductive routes 107. Because copper or other mobile conductive material provides the conductive paths of the semiconductor wafer, the underlying silicon devices must be protected from metal atoms (e.g., Cu) that might otherwise diffuse or migrate into the silicon. Suitable materials for diffusion barrier 105 include tantalum, tantalum nitride, and the like. In a typical process, barrier 105 is formed by a physical vapor deposition (PVD) process such as sputtering, a chemical vapor deposition (CVD) process, or an atomic layer deposition (ALD) process. Typical metals for the conductive routes are aluminum and copper. More frequently, copper serves as the metal in Damascene processes, as depicted in these figures. The metal lines 107 are typically deposited by electrofill methods onto a thin layer of pre-deposited seed layer (not shown). The seed layer is usually deposited by PVD and can be formed by methods that will be described herein in detail. After fill of metal layer 107 (above the field) the excess metal is removed to the dielectric level (as well as portions of diffusion barrier 105 on the field and a portion of the dielectric). This leaves metal inlay 107 exposed on the field region for construction of additional layers. The resultant partially fabricated integrated circuit 100 is a representative substrate for subsequent Damascene processing, as depicted in FIGS. 1B-1G.

Figure 1B:
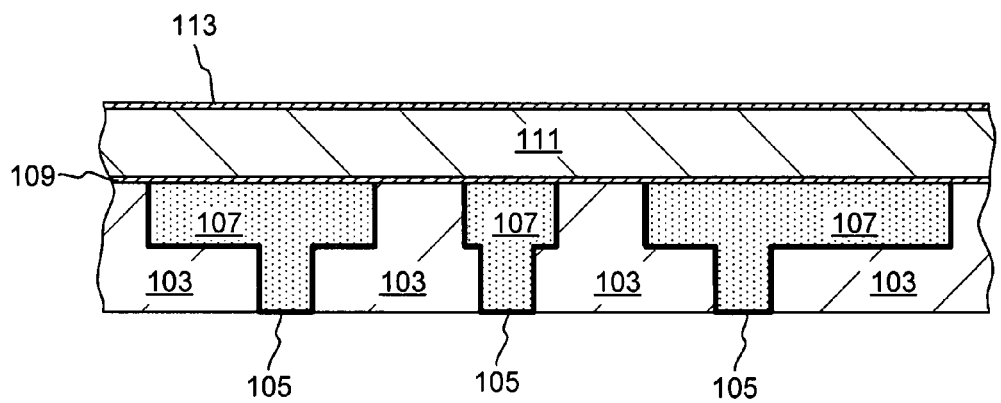

As depicted in FIG. 1B, a diffusion barrier 109 (e.g., silicon nitride or silicon carbide) is deposited to encapsulate conductive routes 107. Next, a first dielectric layer, 111, of a dual Damascene dielectric structure is deposited on diffusion barrier 109. The dielectric 111 is typically a low-k dielectric, such as described above for the layer 103. This is followed by deposition of an etch-stop layer 113 (typically composed of silicon nitride or silicon carbide) on the first dielectric layer 111. Layers 109, 111, and 113 can be deposited by CVD and plasma enhanced CVD (PECVD) methods from a variety of silicon, oxygen, carbon, and nitrogen containing precursors.

Figure 1C:
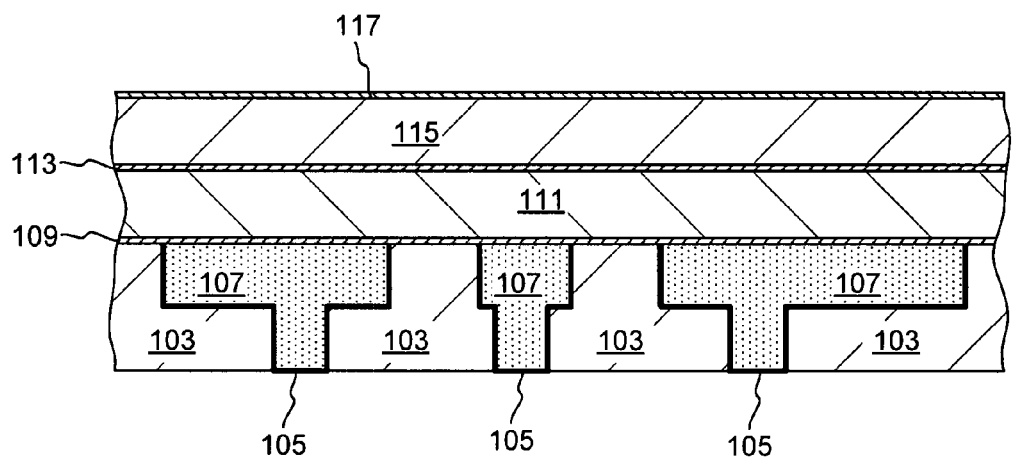

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically containing BARC materials, follows.

Figure 1D:
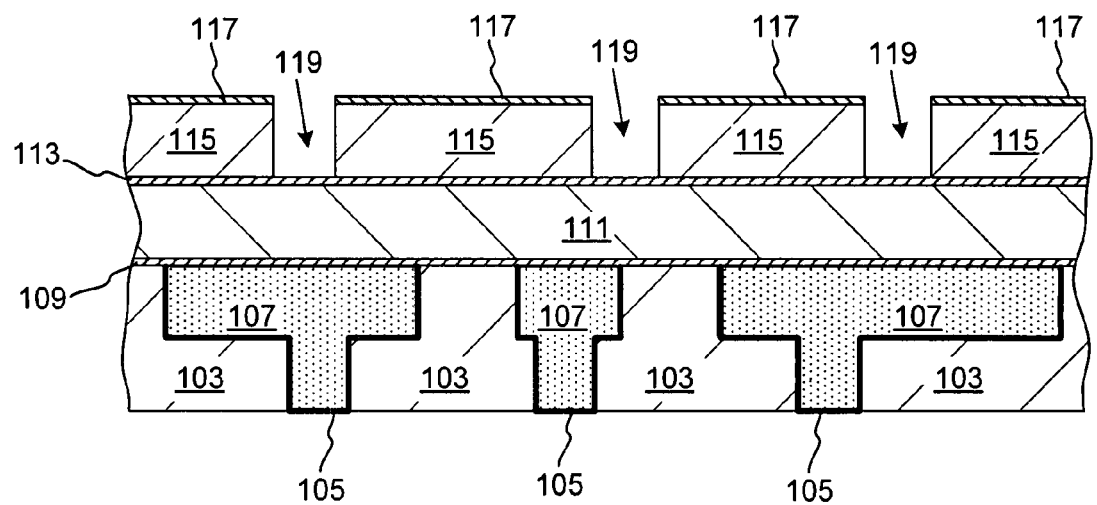
Figure 1E:
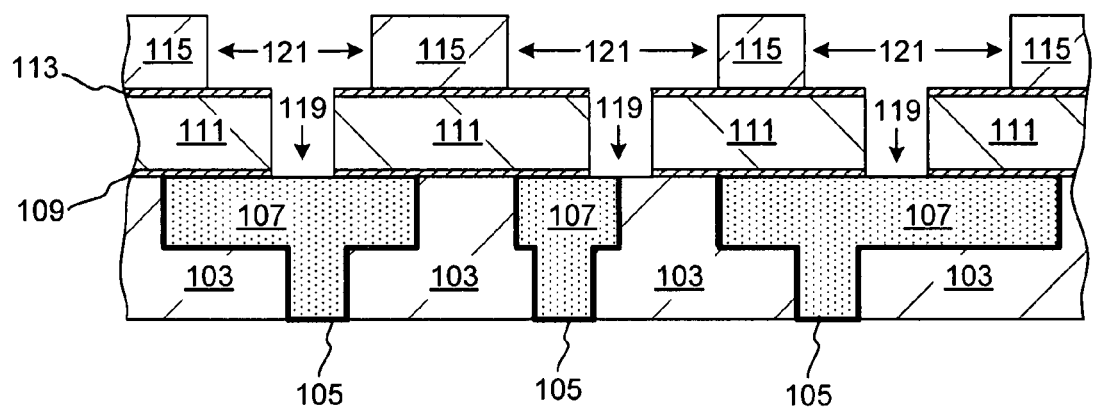

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Figure 1F:
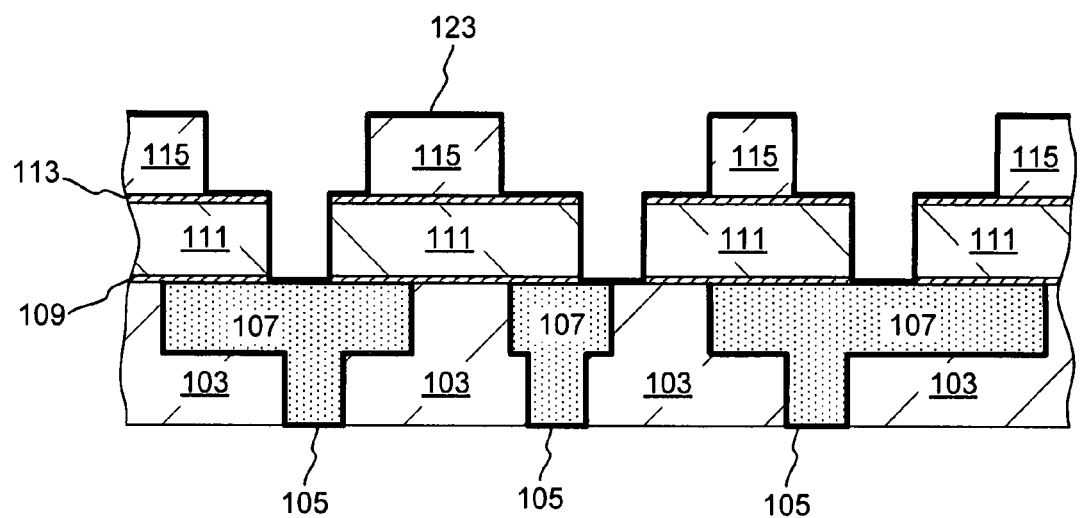

Next, as depicted in FIG. 1F, these newly formed vias and trenches are, as described above, coated with a diffusion barrier 123. In some embodiments, a preclean process, such as Ar sputter etch or reactive preclean, may be needed prior to barrier deposition in order to remove contamination at the via bottom and ensure good ohmic contact. Preclean may be skipped if Barrier First method is the chosen process flow. Examples of Barrier First process flows are described in detail in U.S. Pat. No. 6,764,940, issued on Jul. 4, 2004 naming Rozbicki et al. as inventors. This patent is herein incorporated by reference in its entirety. As mentioned above, barrier 123 is made of Ta, $TaN_x$, Ta/$TaN_x$ bi-layer, or other materials that effectively block diffusion of copper atoms into the dielectric layers. Other suitable diffusion barrier materials include but are not limited to Ti, $TiN_x$, W, $WN_x$, Ru, and Co. In some embodiments diffusion barriers include one or more of titanium-containing materials, such as titanium oxide, titanium nitride and titanium.

After diffusion barrier 123 is deposited, a seed layer of copper or copper alloy is applied (typically by a PVD process which will be described in detail) to enable subsequent electrofilling of the features with copper inlay.

Figure 1G:
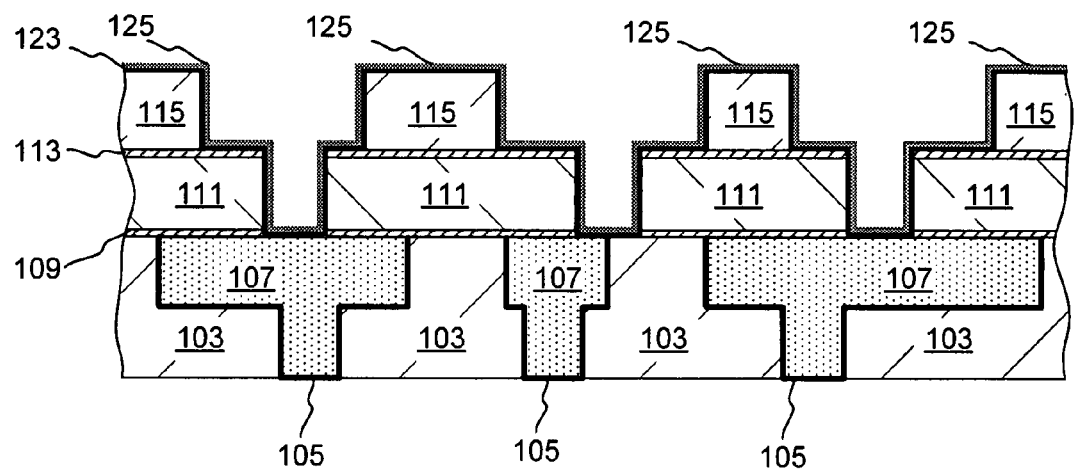
Figure 1H:
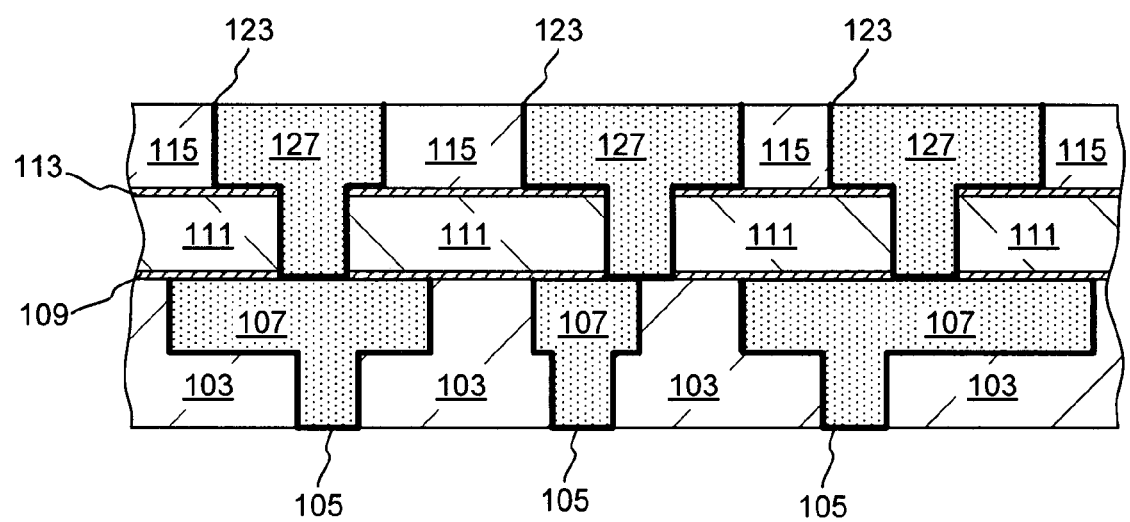

FIG. 1G depicts a copper seed layer 125 deposited on top of the diffusion barrier layer 123. The seed layer should preferably be continuous and should conformally coat the recessed features in order to support the electrofill process. Preferably, recess sidewalls, and various corners within the recesses should be adequately coated by the seed metal. Methods provided herein allow deposition of seed layers with improved coverage, and result in formation of IC devices having increased reliability.

After the seed layer has been deposited, the recesses are electrofilled with copper. During electrodeposition of copper, the seed layer residing on the wafer serves as a cathode with an electrical contact being made at the edge of the wafer. In those cases when the deposited seed layer is discontinuous or has excessively thin portions, voids are formed upon electrodeposition, giving rise to decreased reliability of the formed devices. Voids can also form if the seed layer has been deposited with substantial overhang. The provided methods allow deposition of continuous seed layers with good sidewall coverage and low overhang even for very narrow recesses, e.g., for recesses having widths of less than about 100 nm. Continuous seed layers having adequate thickness in the field, on the recess sidewalls and in the recess bottoms ensure high-quality electrodeposition.

After copper has been electrodeposited, excess copper is removed from the field by, for example, chemical mechanical polishing (CMP). FIG. 1H shows the completed dual Damascene structure, in which copper conductive routes 127 are inlayed (seed layer not depicted) into the via and trench surfaces over barrier 123.

Copper routes 127 and 107 are now in electrical contact and form conductive pathways, as they are separated only by diffusion barrier 123, which is also somewhat conductive.

Figure 2A:
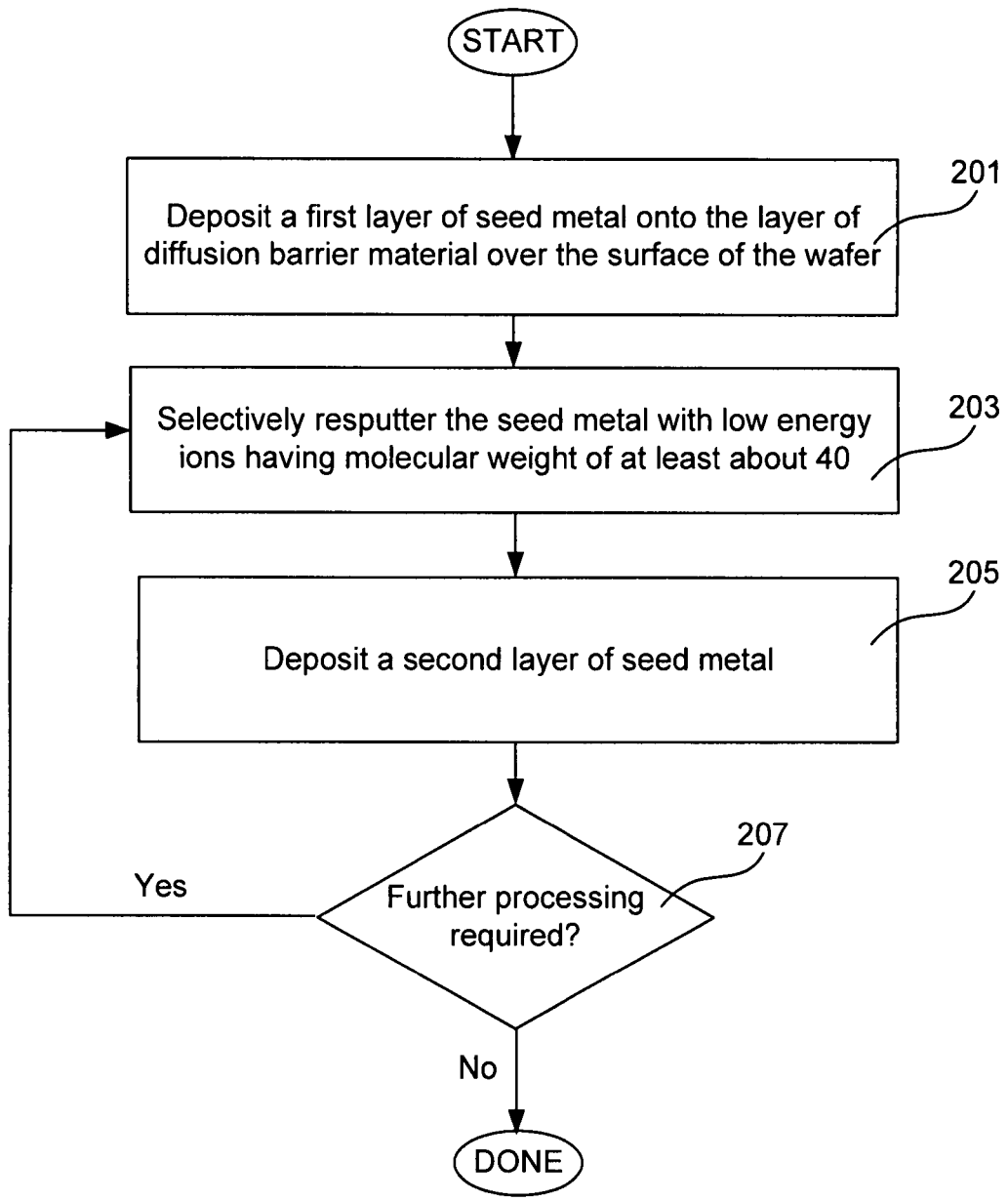
FIGS. 2A-2B presents example process flow diagrams for methods of depositing metal seed layers in accordance with certain embodiments of the present invention.
Figure 2B:
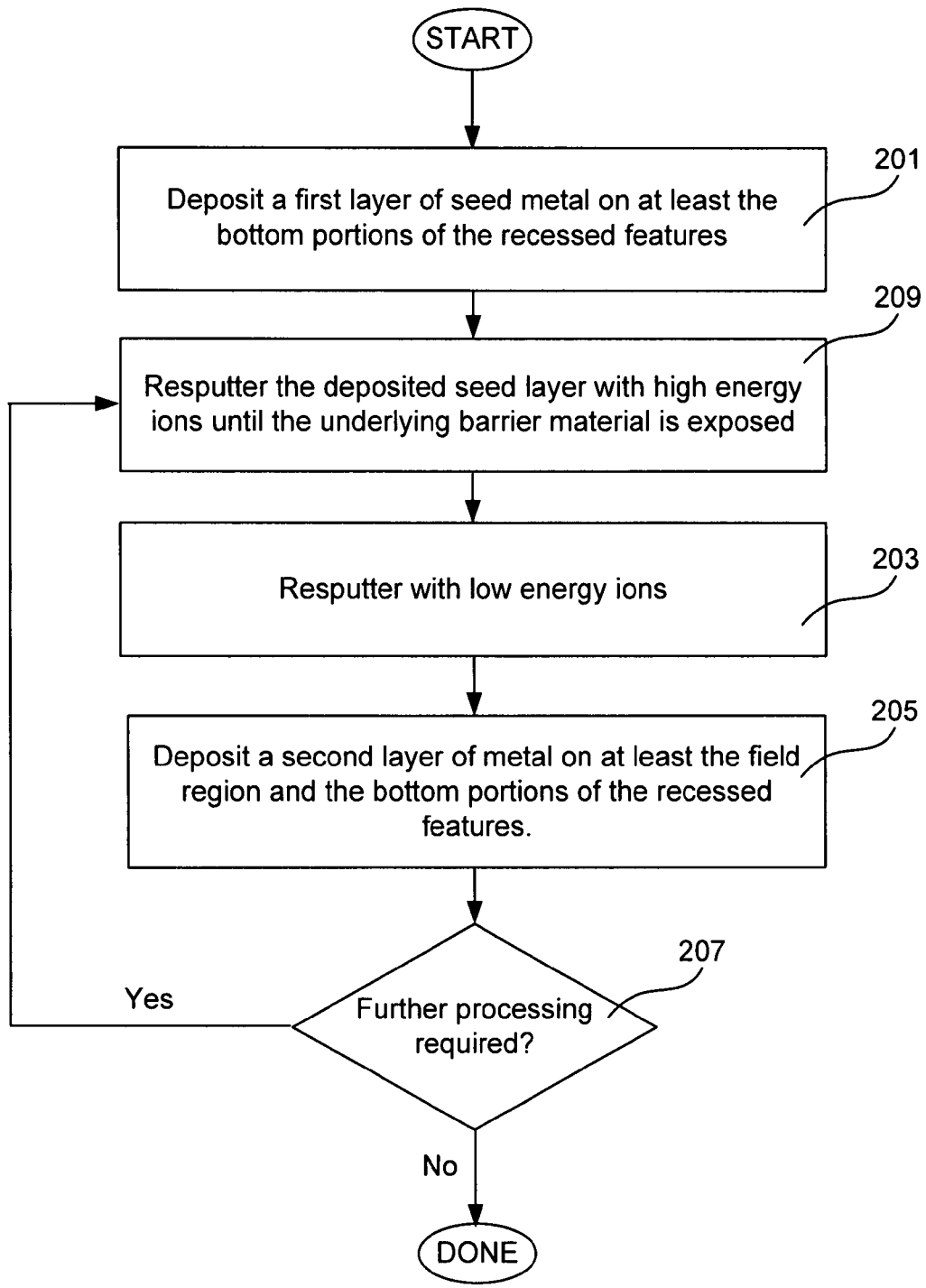

Methods of seed layer deposition according to various embodiments are illustrated in process flow diagrams presented in FIGS. 2A-2B and in cross-sectional interconnect depictions presented in FIGS. 3A-3D.

Seed Layer Deposition Processes Employing Selective Resputtering

As it was mentioned, it is difficult to achieve conformal deposition of seed layers on a substrate having narrow recessed features. Particularly, recessed features having widths of less than about 100 nm, and/or aspect ratios of greater than about 2:1, and 3:1 are difficult to coat. Methods which integrate a low energy resputtering operation into the seed layer deposition process are herein described. These methods allow selective seed layer material sputter etching in the presence of exposed diffusion barrier material and they also provide more manageable overhang shapes. An example seed layer deposition process, according to one embodiment, is illustrated in a process flow diagram shown in FIG. 2A. A variety of seed layer materials may be deposited, including but not limited to copper, aluminum, and silver. Various metal alloys may also deposited by described method. The process starts by providing a semiconductor substrate having a plurality of recessed features (e.g., vias, trenches, contact holes etc.) lined with a layer of diffusion barrier material. Suitable diffusion barrier materials include Ta, $TaN_x$, Ti, $TiN_x$, W, $WN_x$, Ru, Co, etc. The provided methods can be used, for example, to deposit copper or copper alloy on Ta (or $TaN_x$), Ti, Ru, and Co. They are also suitable for depositing aluminum or silver seed layer on Ta diffusion barrier. A variety of other combinations of seed and barrier layer materials is possible. Typically the barrier material has a higher molecular weight than the seed layer material. However, the provided methods, surprisingly, can also be used for deposition of heavier seed materials on a lighter diffusion barrier (e.g., copper on titanium). Note that these methods can also be practiced on a variety of metal nitrides (e.g., $TaN_x$, $TiN_x$, etc.). While some nitrogen may be lost during the resputtering operation, the formed metal layer typically still provides good diffusion barrier properties.

The seed layer deposition process begins with operation 201, which deposits a first layer of seed metal on top of diffusion barrier material over the surface of the wafer. Typically this operation deposits seed layer material on horizontal surfaces of the wafer, such as on the field region, and on the recess bottoms. It also may provide coverage for upper corners of the recesses, sometimes with formation of an overhang. Coverage of recess sidewalls may or may not be adequate depending on the process conditions. In some embodiments a discontinuous layer of seed metal is formed on the sidewall after deposition 201.

After deposition, the first layer of seed metal is selectively resputtered with low energy ions as shown in the process block 203. The selectivity refers to the ratio of seed layer material etch rate to diffusion barrier material etch rate. Selectivities of at least about 5 can be obtained in low energy regime. Resputtering is performed with a process plasma comprising low energy ions and/or neutral atoms having a molecular weight of at least about 40 (e.g., argon ions and copper ions). In some embodiments, resputtering with ions having an energy of less than about 200 eV when they impinge on the wafer, provides the desired selectivity. In one embodiment, selective resputtering removes a portion of seed layer material from the bottom of a recess and redistributes seed layer material onto the recess sidewall. Resputtering may also etch the top corners of the recessed features and may reduce or reshape overhangs. The diffusion barrier may be exposed on the substrate prior to resputtering (e.g., on a discontinuous sidewall seed layer), or the diffusion barrier may be exposed during the resputtering process.

Advantageously, when diffusion barrier is exposed to the resputtering plasma, selective resputtering conditions prevent overetching of the diffusion barrier material. While some diffusion barrier may be removed even during selective resputter, the process can be easily controlled such that the diffusion barrier layer is not excessively thinned or entirely removed at any point on the wafer. Particularly, selective resputtering provides improved seed layer coverage on feature sidewalls, without etching through the diffusion barrier layer at the bottom portions and on the top corners of the recessed features. Thus, exposure of dielectric layer is avoided.

Next, after the resputtering operation, a second layer of metal ("flash layer") is deposited over the surface of the wafer. The flash layer is needed to provide sufficient seed layer coverage in those regions which have exposed barrier or which have been excessively thinned during resputtering. For example, flash layer may be deposited on the field region, on the bottom portions of the recessed features, and on the top corners of the recesses.

After the flash layer has been deposited, it is determined in operation 207, whether further processing of the formed seed layer is required. For example, it may be determined whether the seed layer has been deposited to a desired thickness, or has appropriate conformality. If it is decided that no further processing is required, the process is considered to be complete. If further modification of seed layer is desired, redistribution of metal 203 and flash layer deposition 205 are repeated as many times as necessary. For example, in one embodiment, the process flows according to a scheme: deposition (D)/ resputter (R)/deposition/resputter/deposition. In another embodiment, operations 203 and 205 are further repeated at least once to provide the following process flow: D/R/D/R/ D/R/D. Note that in many embodiments it is highly preferable to end the process with a deposition operation. However, multi-step processes that may end with the redistribution operation are also contemplated in other embodiments. For example, in some embodiments, D/R/D/R or D/R/D/R/D/R process flows may be used.

While resputtering with low energy ions provides excellent etch selectivity between many seed metals and diffusion barrier materials, low energy resputtering often occurs at low etch rates due to low sputter yields observed for low-energy ions. In many embodiments, it is preferable to remove large amounts of seed layer material in a resputtering step. For example, in some embodiments, 20-100%, preferably 30-60% of seed layer material thickness is sputter etched, as measured in the field region. In some embodiments it is desirable to remove all barrier material from the field region during the resputtering step. With low etch rates, removal of large amounts of material may take long times. While in some embodiments long resputter steps are acceptable, in other cases it is desirable to improve throughput by performing quick yet selective resputtering.

The etch rates in resputter depend on a density of resputtering plasma proximate the wafer (e.g., within 5 cm of the wafer). When higher plasma densities are provided to the substrate surface, high etch rates can be achieved even with low ion energies. In a conventional PVD or plasma pre-clean apparatus, plasma densities of about $10^{10}$ ions/cm$^3$ can be achieved. Under these conditions etch rates of about 2 Å/second and greater can be attained. According to some embodiments, etching rates for selective resputtering can be increased to about 5 Å/second and higher by increasing plasma density in the proximity of the wafer. In some embodiments, plasma densities can be increased to about $10^{11}$ ions/ cm$^3$ and even greater using, e.g., high plasma confinement in magnetic field, or a special apparatus configuration capable of extracting ions from high plasma density region to the proximity of the substrate. These methods of high density plasma generation are described, for example, in the U.S. patent application Ser. No. 11/807,183 filed on May 24, 2007 naming R. Kinder as an inventor and in the U.S. patent application Ser. No. 11/807,182 filed on May 24, 2007 naming Pradhan et al. as inventors. Both of these applications are herein incorporated by reference in their entireties and for all purposes. It is noted that in PVD systems, deposition (from target or coil) and sputter etching often occur simultaneously. When sputter etching rate (E) is greater than the deposition rate (D) (an E/D ratio is greater than 1) net material removal occurs, and the process is characterized as resputter. While it is possible to have net deposition in the field and net etching at the feature bottom during selective resputter, the provided resputtering method is preferably performed at an E/D ratio of greater than 1 (e.g., greater than 2) in the field region. In alternative embodiments, the E/D ratio in the field region is less than one (net deposition), while the E/D ratio at the bottom portions of the recesses is greater than 1 (net etching). In yet other embodiments, E/D ratio in the field is less than 1, while the E/D ratio at the corners within the recesses is greater than 1. In this latter embodiment E/D ratio at the feature bottom may be less or greater than 1 depending on the process requirements. Note, that the etch rates discussed above for the resputtering process as well as etching selectivities refer to intrinsic etch rates (E) for the PVD system. However, in some embodiments in a PVD system net etch rates of at least about 2 Å/second and at least about 5 Å/second can be achieved.

In some embodiments, the throughput of the resputtering operation is increased by performing resputtering as a two-step process. At first, resputtering begins in a high energy regime with ion energies of greater than about 200 eV, e.g., greater than about 400 eV. While high energy resputtering is not very selective, it provides high etching rates needed for high throughput. High energy resputtering can proceed, for example at high etch rates of 5 Å/second and greater. In some embodiments, high energy resputtering is performed until the seed layer becomes very thin (e.g., 20 Å or less) or discontinuous at least in one region on the wafer substrate. At this point, to avoid removal of diffusion barrier, the resputtering conditions are switched to provide low energy selective resputter as was described above, and low energy resputter proceeds to redistribute seed layer material as necessary. An example process flow diagram which illustrates seed layer deposition process with two-step resputtering is shown in FIG. 2B. This process is analogous to the process shown in FIG. 2A, but additionally includes a high energy resputtering operation 209, performed prior to low energy selective resputtering 203. The process shown in FIG. 2B may include repeating resputtering and depositing operations as needed. For example, D/R(high energy)R(low energy)/D/R(high energy)R(low energy)/D process sequence may be employed. In some embodiments 2-10 cycles, each comprising a depositing and a resputtering operation (one-stage or two-stage) may be performed to obtain improved step coverage.

Figure 3A:
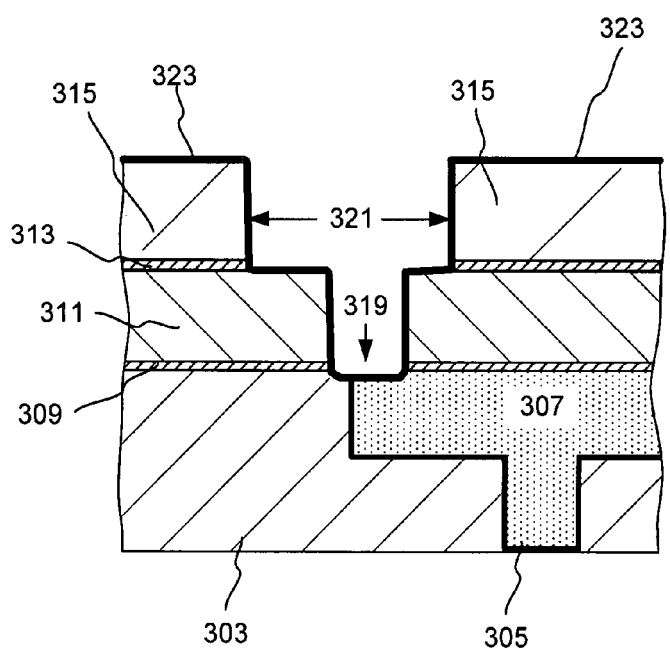
FIG. 3A shows a cross-sectional depiction of an interconnect illustrating a substrate prior to deposition of a metal seed layer.

Device structures obtained during seed layer deposition are illustrated in FIGS. 3A-3D. A typical substrate used in deposition is illustrated in FIG. 3A. The substrate illustrated in FIG. 3A is the same substrate that has been shown in FIG. 1F illustrating the Damascene process flow. The numbering used in FIG. 3A is analogous to the numbering used in FIG. 1F.

The substrate is a multi-layer Damascene structure with a trench 321 and a via 319 formed in the top two layers of inter-metal dielectric 315 and 311. The exposed surface of the wafer is coated with a copper diffusion barrier 323, which lines the substrate surface in the field and within the recesses. Diffusion barrier layer 323 is typically deposited by PVD methods and can be composed of materials such as Ta, $TaN_x$, $Ta/TaN_x$ bi-layer, Ti, W, their nitrides, and the like. Deposition of barrier layers is described, for example, in a commonly assigned U.S. patent application Ser. No. 11/588,586 filed on Oct. 26, 2006, naming Kailasam et al. as inventors, which is herein incorporated by reference for all purposes and in its entirety.

Deposition of the First Layer of Seed Material

The deposition of the first layer of metal in the seed layer as described in operation 201 of FIG. 2A, can be accomplished under a variety of conditions in a number of deposition systems. Typically, the first layer of metal is deposited by PVD, e.g., by iPVD, but may also deposited by ALD methods, e.g., by iALD. A variety of iALD apparatuses may be used, when iALD is employed for the deposition of the first metal layer. ALD deposition of various materials including copper is described in detail, for example, in a commonly assigned U.S. application Ser. No. 11/498,949 filed on Aug. 2, 2006, naming Leeser et al. as inventors. This application is incorporated herein by reference in its entirety.

When PVD is used for deposition, the first layer of metal may be deposited in a PVD apparatus that includes a planar or a three-dimensional target. For example a hollow cathode magnetron (HCM) configuration can be used. An INOVA™ tool commercially available from Novellus Systems, Inc. (San Jose, Calif.), which includes an HCM sputtering source, is an example of a suitable tool for such deposition.

Deposition of seed layers using iPVD is described in detail in U.S. application Ser. No. 11/701,984 filed Feb. 1, 2007 naming Rozbicki as an inventor, which is herein incorporated by reference in its entirety and for all purposes.

Generally, a wide range of conditions corresponding to a variety of deposition regimes, can be used during deposition of the first metal layer. For example, deposition can be performed under a pressure of between about 0.05 and 20 mTorr and at a wafer temperature of between about −50 to +75° C. In certain embodiments, it is preferable to use pressure that is less than about 1 mTorr. During deposition, the target power can be set within a range of between about 10 to 80 kW. The substrate may be biased or unbiased. The RF bias power at the wafer pedestal may range from about 0 to 3000 W for a 300 mm wafer, corresponding to a power density of between about 0-4.5 $W/cm^2$. It is understood, that different PVD systems may require different values of process parameters, and the above ranges are provided as an illustration of one embodiment. In other embodiments, temperature, pressure and power ranges may differ from those presented above. In those embodiments where increased coverage of via bottoms is desirable, the conditions are typically adjusted to increase the amount of highly directional metal particles approaching the wafer at a close to a 90° angle. According to some embodiments, such deposition conditions can be achieved using a target power that is set to a value ranging from about 35-75 kW, e.g., 50-75 kW, and an RF bias power ranging from about 100 W to 500 W. The preferred pressure used in this particular embodiment is less than about 1 mTorr. In other embodiments a highly directional metal flux may be achieved under different conditions, which depend on other parameters of the process, such as magnetic field, etc.

Figure 3B:
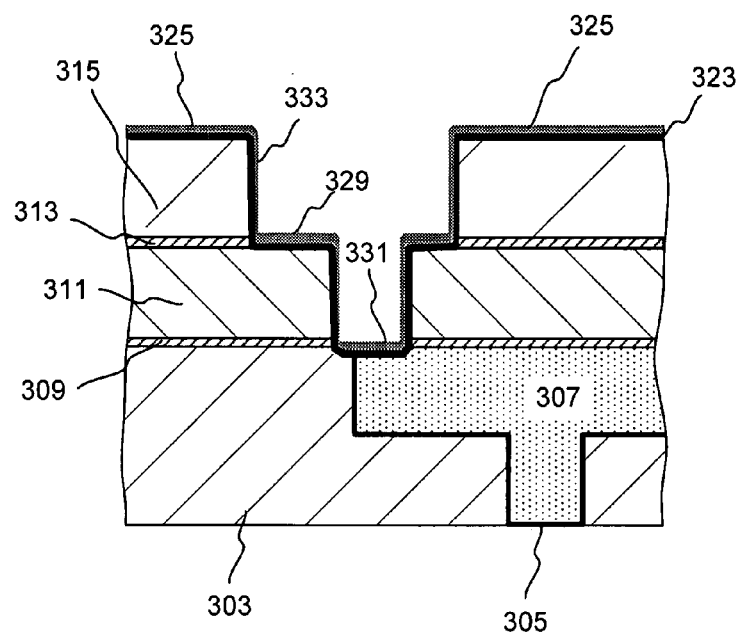
FIG. 3B shows a cross-sectional depiction of an interconnect illustrating deposition of a first metal layer.

The partially fabricated integrated circuit having a deposited first metal layer is illustrated in FIG. 3B. It can be seen that the layer of metal is deposited in the field 325, in the trench bottom 329, in the via bottom 331 and on the sidewalls 333. The thickness of the first metal layer deposited in the field can range from about 200 to 1000 Å, according to one example. In some embodiments, the thickness of the deposited first layer of metal on the bottom of recessed features (e.g., on the bottom of the trench 329 and on the bottom of the via 331) is between about 20 to 100% of the thickness of the first layer of metal deposited on the field (e.g., layer 325). Further, in some embodiments, the thickness of first metal layer deposited on the sidewalls (e.g., layer 333) is between about 10 to 20% of the thickness of the metal layer deposited in the field. The layer of metal on the sidewalls is typically very thin and needs to be improved by a subsequent redistribution operation. In some embodiments, the seed layer on the sidewall is discontinuous.

Selective Resputtering of the First Layer of Metal

After the first layer of metal has been deposited, the selective redistribution operation 203 shown in FIG. 2A, takes place. According to some embodiments, the first layer of metal is redistributed on the wafer from the bottom portions of the recessed features to the sidewalls of the recesses. The redistribution operation serves, in some embodiments, to improve seed layer coverage on the feature sidewalls. It may also be performed to reduce and/or reshape overhang, which may form at the openings of the recesses during deposition of the first metal layer. In some embodiments, such redistribution can be advantageously performed in the same apparatus as the deposition of the first metal layer (e.g., in an iPVD apparatus). Further, the same process gas, such as argon, can be used both during deposition and resputtering. In other embodiments, deposition and redistribution of the first metal layer may be performed in different process chambers. For example, the seed layer may be deposited in an iPVD chamber, while selective resputtering may take place in a plasma pre-clean chamber. In another example, the seed layer may be deposited in an ALD process chamber, and may be then resputtered in a PVD process chamber, followed by a deposition of a flash seed layer in the PVD process chamber. A variety of combinations of process chambers can be used to implement the depositing and resputtering operations. In some embodiments, the process chambers for deposition and resputtering of copper seed layer are integrated in one cluster tool, such that deposition of seed layer occurs without exposing the substrate to ambient atmosphere. For example, the cluster tool can include a copper iPVD process chamber, an iALD process chamber and a plasma pre-clean chamber.

Figure 3C:
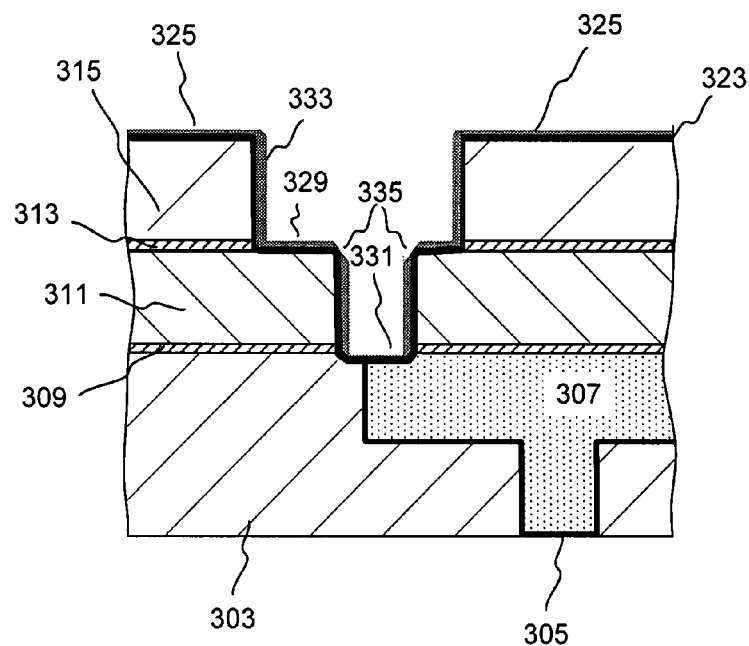
FIG. 3C shows a cross-sectional depiction of an interconnect illustrating selective resputtering of metal.

During resputtering operation, the seed layer material may be completely removed from some portions of the wafer (e.g., from via bottoms and/or from top corners of the vias) to expose an underlying diffusion barrier material. This is illustrated in FIG. 3C, which shows a semiconductor substrate after a selective resputtering operation.

Advantageously, the thickness of the seed layer on the sidewalls 333 is substantially improved during resputter. However, thickness of the layer in the field 325, in the trench bottom 329, and particularly, in the via bottom 331 and at the via top corners 335 is decreased, such that the diffusion barrier material is exposed at the via bottom and at the via top corners. Because selective resputtering provides a significantly higher etch rate for the seed layer material compared to the diffusion barrier material, the diffusion barrier can be substantially preserved, while the seed layer material can be etched and redistributed as needed. In some embodiments, the process is controlled such that the seed layer is resputtered in the presence of exposed diffusion barrier without completely removing diffusion barrier and exposing the dielectric 303 or 311. Preferably, the process is performed such that at least 10 Å thick, preferably at least 20 Å thick diffusion barrier layer remains after the resputtering operation.

Selective resputtering is performed by impinging on the substrate with low energy ions and/or neutral atoms. Surprisingly, it was discovered that one does not necessarily need to use light ions to achieve good selectivity. Heavy ions and neutral atoms can provide excellent etch selectivities when used in a low energy regime. Ions and/or neutral atoms having a molecular weight of at least about 40 (e.g., argon, krypton, xenon, copper, etc.) can be used. It was discovered that at ion energies of less than about 200 eV, etch selectivities of at least about five can be achieved, that is, seed layer is etched five times faster than the diffusion barrier layer.

The resputtering plasma used in selective resputtering may contain low energy ions and/or neutral atoms having a molecular weight of at least about 40 as a major or the only component. While in some embodiments the resputtering plasma may contain a lighter component (e.g., aluminum in a mixture with argon), the presence of a lighter component is not necessary for achieving selectivity. Examples of resputtering plasma compositions that can be used in the described methods include low energy argon plasma; copper plasma; argon and copper plasma; argon and silver plasma; argon and aluminum plasma. In some embodiments, where the plasma contains both argon and metal ions, argon is the major component of the resputtering plasma. In other embodiments, metal-rich plasmas may be used.

Low energy resputtering can be performed in a plasma PVD chamber equipped with a metal target using argon as a working gas. The pressure in the chamber can range from about 0.5 mTorr to about 50 mTorr. The process gas (such as argon) is supplied to the chamber at a flow rate of about 10 to 1000 sccm. The target is negatively biased during resputter at a power level ranging from about 500 W to about 10 kW. An external RF bias may be provided to the wafer at a power level of less than about 2,000 W, preferably less than about 600 W for a 300 mm wafer, corresponding to a power density of less than about 3.0 W/cm$^2$, preferably less than about 1.0 W/cm$^2$.

In some embodiments, no external bias is provided to the wafer, which acquires self-bias in the plasma PVD chamber.

In a specific example, copper seed layer is selectively resputtered in a presence of tantalum diffusion barrier layer using a plasma containing low energy argon and copper ions. Resputtering is performed at a pressure of about 3 mTorr, the DC target power of about 4 kW, and an RF wafer power of about 400 W. The wafer is cooled down to 0° C. during resputtering.

In other embodiments, low-energy resputtering is performed in a plasma-pre-clean chamber without a metal target.

In those embodiments, where resputtering is performed as a two-stage process which includes a high energy resputter and low energy resputter, the process typically starts in a high energy resputter regime characterized by ion energies of greater than about 200 eV. Example conditions for such process include DC target power of about 4 kW, RF wafer bias power of about 1500 W, and pressure of about 7 mTorr. When process is switched to low energy resputter the wafer bias power is reduced to about 400 W, the pressure is reduced to about 3 mTorr, and the magnetic field shape is adjusted to increase plasma density near the wafer.

Deposition of the Second Layer of Metal

After resputtering is completed, the seed layer is often discontinuous. As shown in FIG. 3C, the seed layer may be discontinuous on the via bottom 331, and at the faceted top corners of the via 335. The discontinuous seed layer can be improved as shown in operation 205 of FIG. 2, by depositing a second layer of seed metal, at least on the recess bottoms, and/or recess top corners. Some deposition on the sidewalls can also be achieved. Deposition of the second layer of metal sometimes referred to as a "flash layer", can be performed in an apparatus and under the process conditions that were described above for deposition of the first layer of metal. For example an iPVD or an iALD process may be used for the flash layer deposition. While in some embodiments deposition of the second layer of metal is performed in the same apparatus and under the same conditions as deposition of the first layer, in other embodiments different deposition tools and different process conditions may be employed for the operations 201 and 205.

In some embodiments, all three operations, 201, 203, and 205 may be performed in one iPVD process chamber without breaking the vacuum. Process parameters for deposition of the first metal layer 201 and for deposition of the second layer 205 in this embodiment may be the same or may differ.

Figure 3D:
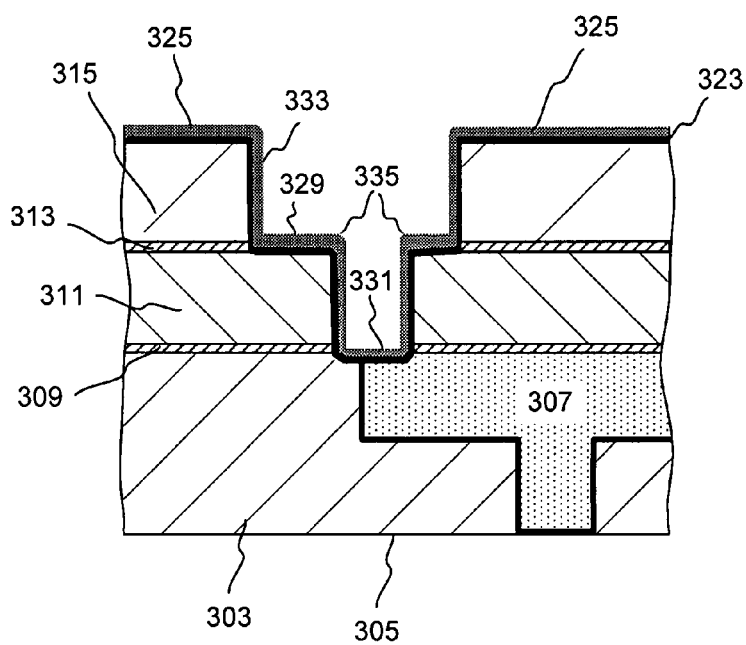
FIG. 3D shows a cross-sectional depiction of an interconnect illustrating deposition of a second metal layer.

In some embodiments, the second layer of metal is deposited to a thickness of between about 30-150 Å measured in the field. FIG. 3D illustrates a cross-sectional depiction of an example IC structure upon completion of deposition of a seed layer, according to methods described herein. It can be seen that after the second layer of metal has been deposited, the seed layer thickness in the field 325 is increased. Such increase in seed layer thickness allows minimization of terminal effect during subsequent electrofill operations. The bottom of the via 331 and the bottom of the trench 329 are adequately covered to ensure continuity and appropriate thickness of the seed layer. The seed layer coverage on the corners 335 located within the recesses is also substantially improved by deposition of the second metal layer on the exposed faceted regions.

As a result, seed layer deposition methods described herein can afford continuous seed layers with improved coverage and optimal thickness in the field, in the recess bottoms, on the sidewalls and on the corners within recesses. This decreases the amount of defects during subsequent electroplating operations and leads to improved reliability of IC devices during end use. Low energy selective resputtering, when integrated into the seed layer deposition process, provides improved seed layer coverage on the recess sidewalls and also effectively reduces overhangs, while preserving the diffusion barrier material and thereby protecting the dielectric.

While low energy resputtering is particularly advantageous for providing etch selectivity between seed layer and diffusion barrier materials, it also has several additional benefits which are not related to selectivity. According to some aspects of the invention, low energy resputtering is provided for processes which do not necessarily require seed/barrier etch selectivity. For example, low energy resputtering provides improved overhang shaping compared to high energy resputtering. Further, resputtering with low energy ions and/or neutral atoms results in reduced heating of the substrate, and therefore low energy process requires less substrate cooling.

Figure 4A:
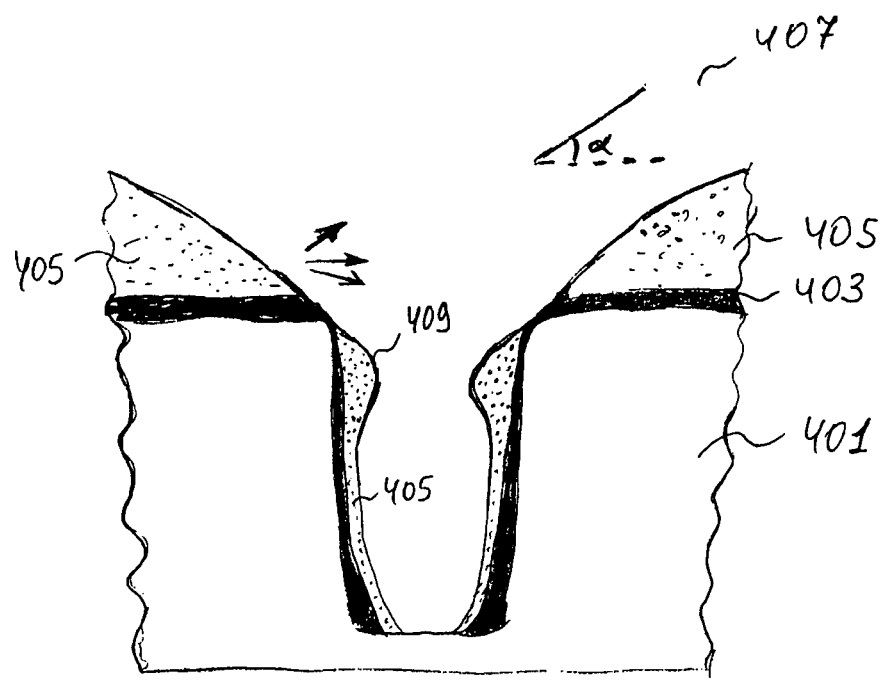
FIG. 4A illustrates a cross-sectional depiction of a trench, undergoing high energy resputter. Discontinuous diffusion barrier layer and large facet angle at the trench opening are illustrated.
Figure 4B:
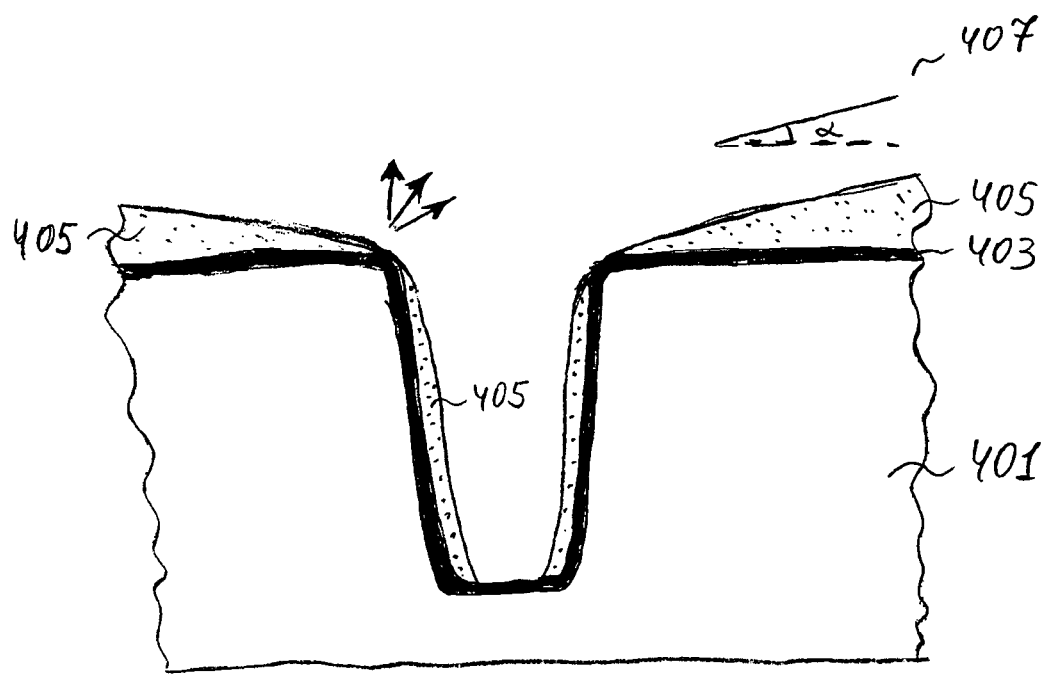
FIG. 4B illustrates a cross-sectional depiction of a trench, undergoing low energy resputter according to an embodiment described herein. Continuous diffusion barrier layer and small facet angle at the trench opening are illustrated.

FIG. 4A provides a cross-sectional depiction of a trench, which has been subjected to high energy seed layer resputtering, e.g., resputtering with argon plasma having ion energies of greater than about 400 eV. FIG. 4B provides a cross-sectional depiction of an analogous trench subjected to low energy resputtering, e.g., resputtering with argon plasma having ion energies of less than about 200 eV. Referring to FIG. 4A, it can be seen that a trench residing in a layer of dielectric 401 is lined with a discontinuous diffusion barrier layer 403, and a discontinuous seed layer 405. The diffusion barrier has been inadvertently removed from the trench bottom and from the trench top corners during non-selective resputter process, such that a layer of dielectric 401 is exposed. Further, high-energy resputtering forms a large facet angle α at the top corners of the trench and a steep slope of seed layer at the trench opening to the field region, as illustrated by the angle 407. When large facet angle is formed, the seed layer material tends to be resputtered from one side of the trench opening to the opposite side, as shown by the arrows, thereby forming a low-lying overhang 409. Such overhangs are difficult to remove and are highly undesired.

In contrast, when low energy resputtering is used, the barrier layer 403 is preserved at the bottom of the trench and at its top corner, as shown in FIG. 4B. Advantageously, the facet angle α, is substantially smaller for low energy resputtering resulting in a flatter profile of seed layer at the trench opening. Undesired redistribution of seed layer material from one side of the trench opening to the opposite side is less pronounced during low energy resputter. As shown by the arrows in FIG. 4B, resputtering of seed layer material from a flatter surface at the trench opening directs the resputtered material away from the wafer. Facet angles of less than about 40 degrees, preferably less than about 20 degrees can be obtained with low energy resputtering. Even when overhangs are formed during low-energy resputtering they are typically higher-lying and are easier to remove during the course of resputter. As illustrated in FIG. 4B, at the end of resputtering process there is substantially no overhang.

The methods of low energy resputtering have been evaluated experimentally. In addition, selectivities for a variety of different seed layer/barrier layer materials have been studied using theoretical simulation plots.

Figure 5A:
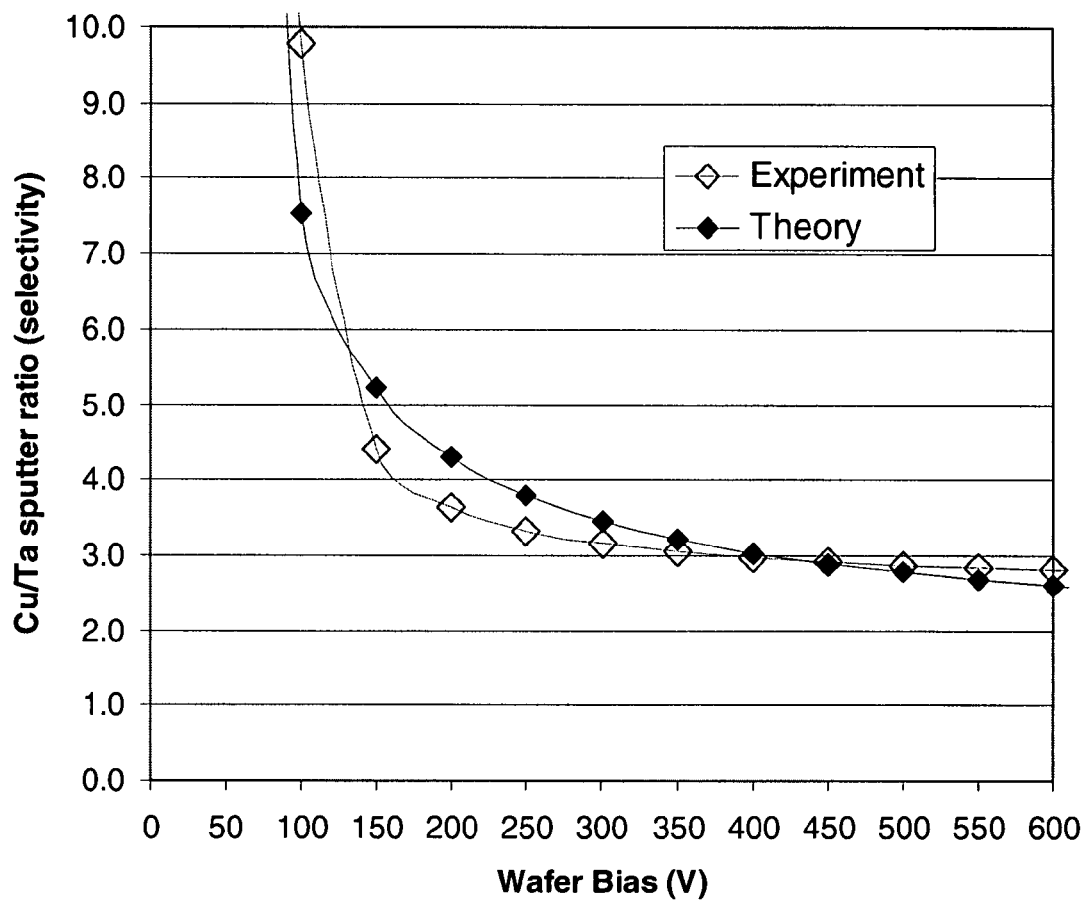
FIG. 5A is a plot illustrating Cu/Ta selectivity as a function of wafer bias. Experimental and theoretical curves are illustrated.

Experimental and theoretically calculated data for resputtering of copper in the presence of tantalum with argon ions is illustrated in FIG. 5A, which provides a plot of Cu/Ta sputter selectivity as a function of the wafer bias. The wafer bias is directly related to the ion energy of ions impacting the wafer. For example, a wafer bias of 200 V corresponds to an average ion energy of 200 eV. It can be seen from FIG. 5A, that resputtering selectivity increases as the wafer bias is decreased. The experimental data is in excellent agreement with the provided calculations. Selectivities of greater than about 4 are achieved at a wafer bias of less than about 200 V. Selectivities of up to 10 can be achieved with the use of lower ion energies. The theoretical curve corresponds to resputtering with argon ions exclusively, while the experimental curve corresponds to resputtering with a plasma containing predominantly argon ions with a small amount of copper ions (less than about 10%).

Figure 5B:
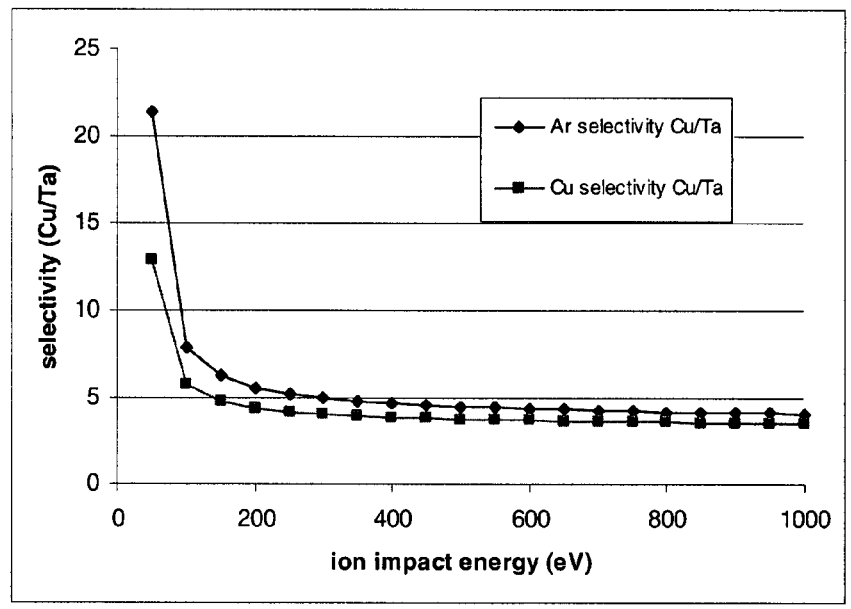
FIG. 5B is a simulation plot illustrating Cu/Ta selectivity as a function of ion impact energy. Curves illustrating resputtering with argon ions and resputtering with copper ions are shown.

FIG. 5B provides a simulation plot for Cu/Ta selectivity as a function of ion impact energy for different resputtering species. It can be seen that both copper ions and argon ions are capable of highly selective resputter at low energies. Resputtering with argon ions is somewhat more selective than resputtering with copper ions. Selectivity of resputtering with copper ions is significantly increased at ion energies of about 100 eV and lower. While in many embodiments it is preferred to resputter with argon as a major species of the plasma, in some embodiments copper may be the major or the only species.

Figure 5C:
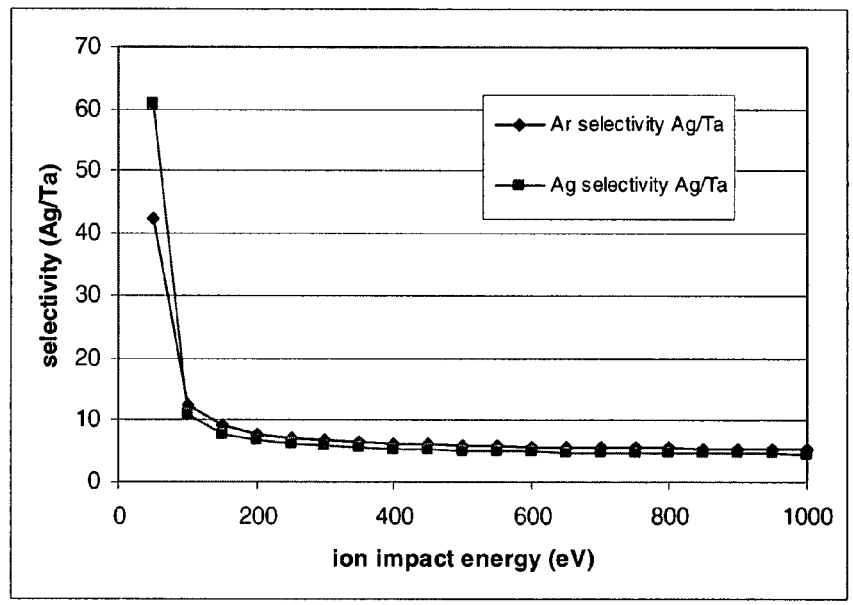
FIG. 5C is a simulation plot illustrating Ag/Ta selectivity as a function of ion impact energy. Curves illustrating resputtering with argon ions and resputtering with silver ions are shown.

Provided methods are not limited to copper seed resputter and can be used to resputter other metals. Specifically, calculations confirm that silver seed layers can be selectively resputtered in the presence of tantalum barrier material using argon or silver plasma. The etching selectivity is substantially increased to 10 and higher when ion energy is about 100 eV and lower. A simulation plot for Ag/Ta selectivity as a function of ion impact energy for argon and silver resputtering species is shown in FIG. 5C.

Figure 5D:
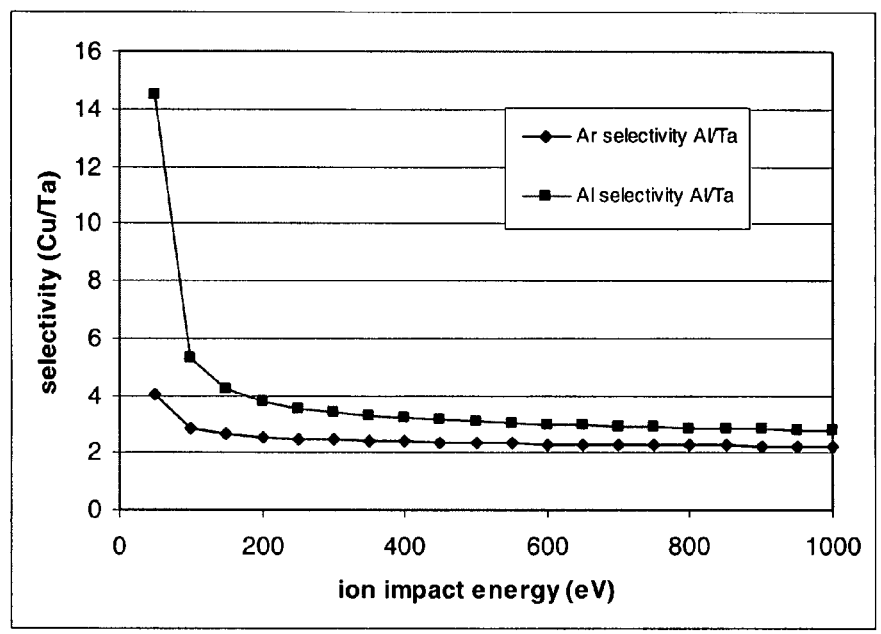
FIG. 5D is a simulation plot illustrating Al/Ta selectivity as a function of ion impact energy. Curves illustrating resputtering with argon ions and resputtering with aluminum ions are shown.

Aluminum seed layer can also be selectively resputtered using provided methods. FIG. 5D shows a simulation plot for Al/Ta selectivity as a function of ion impact energy for argon and aluminum resputtering species. It can be seen that selectivities of greater than about 4 can be achieved with argon resputtering at ion energies of less than about 200 eV.

Figure 5E:
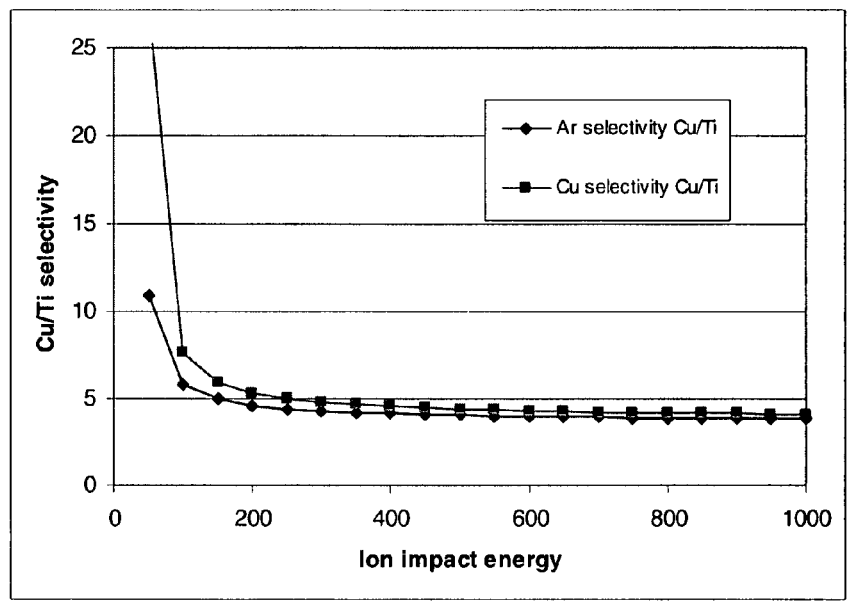
FIG. 5E is a simulation plot illustrating Cu/Ti selectivity as a function of ion impact energy. Curves illustrating resputtering with argon ions and resputtering with copper ions are shown.

The provided methods can also be used for other barrier materials beyond tantalum. Surprisingly it was discovered that selective resputtering is possible for a seed layer material with higher atomic weight in the presence of some barrier materials with lower molecular weight. For example it is possible to selectively resputter copper seed layer in the presence of titanium barrier. A simulation plot showing Cu/Ti selectivity as a function of ion impact energy for resputtering with argon ions and copper ions is shown in the FIG. 5E. It can be seen that selectivities of greater than about 5 can be obtained at ion energies of less than about 200 eV.

Provided methods can also be used for resputtering copper seed layers in the presence of ruthenium, cobalt, and tungsten barrier materials.

Apparatus

While various embodiments of the present invention can be practiced in many different types of apparatus, two main types of iPVD apparatus, hollow cathode magnetron (HCM) and planar magnetron, will now be briefly described. Hollow cathode magnetron is an apparatus carrying a three-dimensional sputter target. The present invention is not limited to a specific cup-like geometry of an HCM target and can be used in conjunction with three-dimensional targets of a plurality of shapes.

Figure 6:
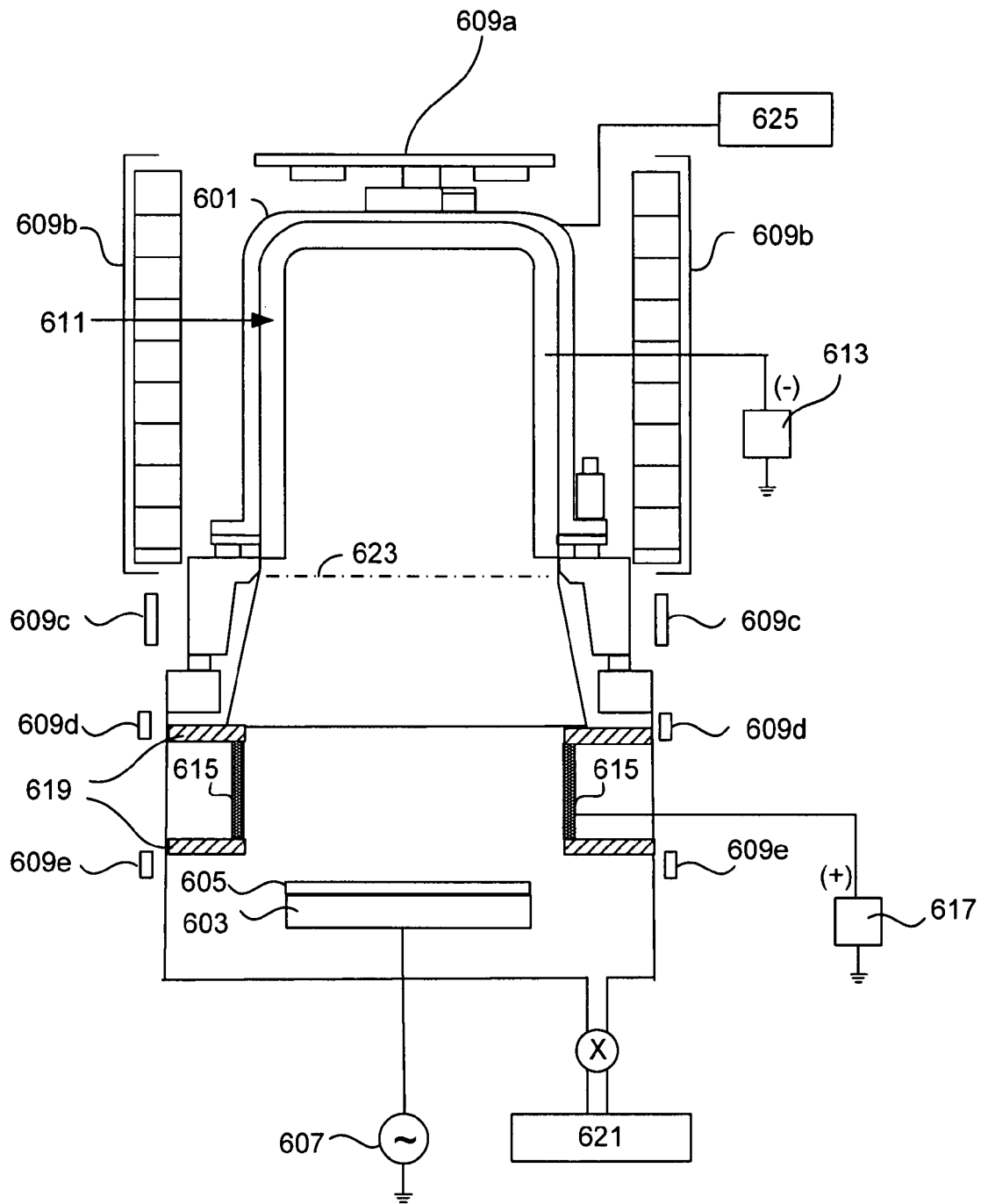
FIG. 6 is a cross sectional depiction of the hollow cathode magnetron (HCM) apparatus suitable for practicing the current invention.

FIG. 6 presents a cross sectional view of one type of an HCM sputtering apparatus in accordance with one embodiment of the invention. The HCM apparatus has two main components, the source 601, in which a plasma is created and maintained, and the RF bias electrostatic chuck (ESC) pedestal 603, which secures the wafer 605 and applies a negative RF bias on the wafer if needed. A separate RF power supply 607 is electrically connected to the wafer pedestal and provides the RF bias to the pedestal 603 when required, leading to generation of a negative DC bias at the wafer, upon interaction of the biased wafer with the plasma. An RF bias power of between about 0-3,000 W can be applied, with power of less than about 2,000 W, preferably less than about 600 W being preferred for low energy resputtering. Energy of impacting ions is primarily controlled by the bias at the wafer, with lower bias resulting in lower ion energy. The ESC pedestal 603 also serves to provide the temperature control for the wafer 605. The temperature at the wafer pedestal can range from about −50 to 600° C., preferably between about −40 and 20° C. For copper seed layer deposition, temperatures from about −40 to 100° C. are preferred.

In this example, the HCM contains a top rotating magnet 609a, several annular side electromagnets 609b-609e, circumferentially positioned around the process chamber, and a sputter target 611, operated at a negative DC bias. The sputter target is electrically connected to the DC target power supply 613. A DC bias power of between about 1-100 kW is typically applied to the target.

One or several shields may be positioned within the chamber next to the chamber sidewalls, to protect the sidewalls from the sputtered material. In the provided configuration, the shield 615 is positively biased and serves as an "ion extractor", configured to increase plasma density in the proximity of the wafer by transferring ions from a high plasma density region to the wafer region. The ion extractor 615 is electrically connected to a separate DC power supply 617 and is configured to accept a positive bias from the power supply 617. A positive bias of at of at least about 30 V, preferably between about 50 and about 300 V, and even more preferably between about 100V and about 150 V is applied to the ion extractor. In one implementation, a power ranging from about 10 and 600 W is applied to the ion extractor.

The ion extractor shield 615 is electrically isolated from the process chamber sidewalls with two insulating ceramic rings 619. In the provided example, the shield 615 is an aluminum member having a hollow cylindrical shape, which is located about 8 cm above the wafer pedestal 603, and about 16 cm below the target 611. Note, that since the ion extractor is positively biased during operation of an HCM, its material is not substantially sputtered onto the wafer surface. Therefore, the ion extractor can be made of a variety of conductive materials, which may be different from the material being deposited or resputtered on the wafer. For example, an aluminum ion extractor can be used during tantalum or copper resputter.

The cathode target 611 generally has a hollow cup-like shape so that plasma formed in the source can be concentrated within this hollow region. The cathode target 611 also serves as a sputter target and is, therefore, made of a metal material which is to be deposited onto a substrate. For example, a copper target is used for copper seed deposition and aluminum target is used for aluminum seed deposition.

An inert gas, such as argon, is introduced through a gas inlet (not shown to preserve clarity) into the process chamber from the sides, just below the ion extractor 615. The pump 621 is positioned to evacuate or partially evacuate the process chamber. The control of pressure in the process chamber can be achieved by using a combination of gas flow rate adjustments and pumping speed adjustments, making use of, for example, a throttle valve or a baffle plate. Typically the pressure ranges between about 0.01 mTorr to about 100 mTorr during the deposition and resputtering processes.

An intense magnetic field is produced by electromagnets 609b within the cathode target region. The electrons emitted from the cathode are confined by the crossing electrical and magnetic fields within the hollow portion of the cathode target 611 to form a region of high plasma density within the hollow cathode. Additional electromagnets 609c-609e are arranged downstream of the cathode target and are used to shape the plasma at the elevations closer to the wafer pedestal 603. The magnetic field generated by electromagnets 609c-609e is typically less strong than the magnetic field generated by the magnets 609a-609b.

When a positive bias is applied to the ion extractor 615, electrons are transferred from the region of plasma within the hollow cathode region to the region of plasma proximate the wafer. Positive ion density is also increased in the region proximate the wafer due to a requirement of plasma quasi-neutrality. Since the ion extractor 615 is positively biased, the ions do not reach the ion extractor and are electrostatically trapped in the proximity of the wafer. Therefore, the plasma density proximate the wafer is significantly increased. Plasma densities of about $10^{10}$-$10^{11}$ ions/cm$^3$ can be obtained proximate the wafer.

In the described embodiment, the confinement of plasma in the region of high plasma density within the hollow target 611, is further increased by the presence of a separatrix 623. Separatrix 623 is an imaginary line associated with the distribution of the magnetic field lines within the chamber, which divides the magnetic field confining the plasma within the hollow target region from the magnetic field downstream in the proximity of the wafer. The separatrix 623 includes a region of null magnetic field residing between the target 611 and the wafer 605, which allows for transfer of ions from the region of plasma confined at the target to the proximity of the wafer. Typically, in an HCM, the separatrix resides in the proximity of the target opening, but can be moved upward or downward in the chamber by the modulation of magnetic field polarity of individual magnets. The separatrix can be formed by using magnetic fields of opposite polarities to confine the upper and lower regions of plasma. The separatrix is desired for maintaining a high plasma density in the plasma region adjacent to the target, since it confines electrons and positively charged ions within this region.

In certain embodiments, a system controller 625 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the apparatus. The system controller executes system control software including sets of instructions for controlling the timing, mixture of gases, chamber pressure, chamber temperature, wafer temperature, RF power levels at the wafer, DC power levels at the target, polarity of electromagnetic coils 609a-e, power levels and current levels applied to the coils, power levels and a bias, applied to the ion extractor 615, wafer chuck or susceptor position, and other parameters of a particular process. Other computer programs stored on memory devices associated with the controller may be employed in some embodiments.

Typically there will be a user interface associated with controller 625. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, magnetic field within the chamber, electric field proximate the ion extractor, plasma density within the chamber, process gas composition and flow rates, temperature, pressure, plasma conditions such as RF and DC power levels, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A plasma control program may include code for setting RF power levels applied to the wafer chuck, DC power levels applied to the target, DC or RF power levels applied to the ion extractor, as well as polarity parameters and current levels applied to different electromagnetic coils in an apparatus. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

In one embodiment, the controller includes instructions for performing deposition or resputtering according to methods described above. For example, the instructions can specify the parameters needed to perform the deposition/resputter/deposition sequence and may specify the process parameters for selective resputter.

Figure 7:
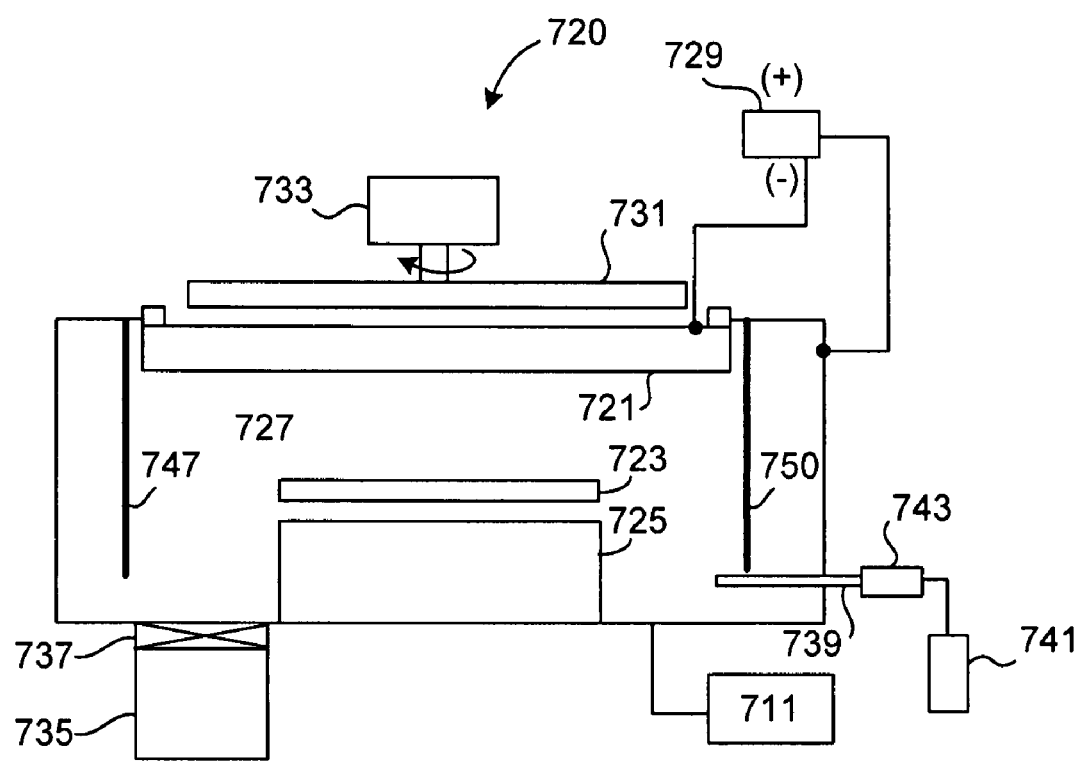
FIG. 7 is a cross sectional depiction of a planar magnetron suitable for practicing the current invention.

According to other embodiments of the invention, the seed layer can be deposited using a planar magnetron. FIG. 7 shows a schematic representation of an example planar magnetron 720. Target 721, a circular, planar block of material to be deposited, is spaced from the wafer 723, which is mounted on a heating stage 725 in chamber 727. A DC power supply 729 is used to apply a DC field to target 721, establishing a plasma in the chamber below target 721. A circular magnet 731 mounted above the target is rotated by motor 733 setting up a magnetic field extending through target 721 into the region between the target 721 and wafer 723. cryopump 735 connected to chamber 727 via valve 737 is used to evacuate the chamber. Process gas injector 739 is connected to process gas supply 741 via mass flow controller 743. A sputtering gas is introduced into chamber 727 via injectors 739. It is understood that the structure of module 720 is exemplary only. The methods of present invention may be practiced in other types of planar magnetrons, such as ones having ICP sources. It is noted that the methods of present invention do not require the presence of an RF-biased coil within the apparatus, although they can be practiced in an apparatus equipped with such coil.

EXPERIMENTAL

Example experimental process parameters for a copper seed layer deposition process are provided in Table 1. The entire process was performed in a copper deposition chamber in an HCM using argon as a process gas during all three operations of the process. Resputtering involved exposing the substrate to a resputtering plasma which included copper ions sputtered from the target and argon ions. No species of low molecular weight (e.g., He) was required to obtain high selectivity. A selectivity of about 10 was observed during low energy resputtering.

TABLE 1

Example experimental process parameters for seed layer deposition process, according to a method described herein.

| Parameter/Process | Deposition | Low Energy Resputter | Flash |
| --- | --- | --- | --- |
| DC Target Power (kW) | 70 | 4 | 70 |
| RF Wafer Bias Power (W) | 0 | 387 | 0 |
| Ion Extractor Voltage (V) | 0 | 140 | 0 |
| Argon Flow Rate, Sccm | 2 | 75 | 2 |
| Pressure, mTorr | 0.08 | 3 | 0.08 |
| Net Deposition or Etch Rate in the Field, Å/second | 50 (deposition) | 4 (etch) | 50 (deposition) |
| Thickness of Deposited or Etched Layer in the Field, Å | 400 (deposition) | 200 (etch) | 60 (deposition) |
| E/D ratio | Deposition only | 2 | Deposition only |

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of depositing a seed layer material on a wafer substrate having a recessed feature, the method comprising:
    (a) depositing a first portion of the seed layer material over the surface of the substrate;
    (b) selectively sputter etching a portion of the seed layer material in a presence of an exposed diffusion barrier material such that a rate of seed layer material etching is at least about 5 times greater than a rate of diffusion barrier material etching, wherein the selective sputter etching comprises impinging on the wafer substrate with low energy ions and/or neutral atoms, wherein the majority or substantially all of said ions and/or neutral atoms have a molecular weight of at least about 40; and
    (c) depositing a second portion of the seed layer material over the surface of the wafer.

2. The method of claim 1, wherein the low energy ions comprise argon ions.

3. The method of claim 2, wherein the energy of argon ions is less than about 200 eV.

4. The method of claim 2, wherein the energy of argon ions is about 100 eV.

5. The method of claim 2, wherein the low energy ions further comprise copper ions.

6. The method of claim 1, wherein the low energy ions comprise copper ions.

7. The method of claim 1, wherein the seed layer material comprises copper or copper alloy.

8. The method of claim 1, wherein the seed layer material comprises copper or copper alloy and the diffusion barrier material comprises tantalum.

9. The method of claim 1, wherein the seed layer material comprises copper or copper alloy and the diffusion barrier material comprises titanium.

10. The method of claim 1, wherein the seed layer material comprises copper or copper alloy and the diffusion barrier material comprises a metal selected from the group consisting of cobalt, ruthenium or tungsten.

11. The method of claim 1, wherein the seed layer material comprises silver or aluminum and the diffusion barrier material comprises tantalum.

12. The method of claim 1, wherein (a) comprises depositing a seed layer material at least on a bottom portion of the recessed feature; (b) comprises redistributing at least some of the deposited seed layer material from the bottom of the recessed feature to the feature sidewalls; and (c) comprises depositing a seed layer material at least on the bottom portion of the recessed feature.

13. The method of claim 1, wherein (a) comprises depositing a seed layer material at least on a top corner of the recessed feature; (b) comprises sputtering at least some of the deposited seed layer material from the top corner of the recessed feature; and (c) comprises depositing a seed layer material at least on the top corner of the recessed feature.

14. The method of claim 1, wherein (b) comprises etching the seed layer at an etch rate of at least about 2 Å/second.

15. The method of claim 14, wherein the etch rate is a net etch rate.

16. The method of claim 14, wherein (b) comprises etching the seed layer at an etch rate of at least about 5 Å/second.

17. The method of claim 1, further comprising sputter etching the seed layer material prior to (b) with ions of higher energy than ions used for sputter etching in (b).

18. The method of claim 17, further comprising repeating sputter etching the seed layer material with higher energy ions and the selective sputter etching with low energy ions at least once.

19. The method of claim 18, further comprising depositing a layer of metal over the surface of the wafer substrate after the sputter etching operations are repeated.

20. The method of claim 1, wherein (b) comprises selectively removing seed layer material within a recessed feature, while simultaneously depositing seed layer material in a field region, wherein an etch rate to deposition rate ratio in the field region is less than 1.

21. The method of claim 1, wherein (b) comprises providing a bias power of less than about 600 W to the wafer.

22. The method of claim 1, wherein (b) comprises selectively sputter etching the seed layer material on the wafer with low energy ions, wherein the wafer is not externally biased.

23. The method of claim 1, wherein (b) is performed in a PVD process chamber or in a plasma pre-clean process chamber.

24. A method of resputtering a layer of metal on a wafer substrate having a recessed feature, the method comprising resputtering the layer of metal by impinging on the layer of metal with argon and/or copper ions, wherein the energy of the impinging ions is less than about 200 eV, and wherein resputtering comprises sputter etching the layer of metal at least in one location on the wafer at a net etch rate of at least about 2 Å/second.

25. An apparatus for depositing a metal seed layer on a semiconductor wafer having recessed features and a field region, comprising:
(a) a process chamber having a target for sputtering a metal onto the semiconductor wafer;
(b) a wafer support for holding the wafer in position during deposition of the metal; and
(c) a controller comprising program instructions for
(i) sputtering the metal from the target onto the semiconductor wafer under conditions that coat at least the bottom portions of the recessed features and the field region thereby forming a first layer of metal;
(ii) subsequently selectively resputtering the first layer of metal to redistribute the metal from the bottom portions of the recessed features to the sidewalls of recessed features without substantially removing a layer of diffusion barrier material residing at the bottom and/or top corner portions of the recessed features, wherein resputtering is performed with low energy argon and/or metal ions, such that a rate of the first layer of metal etching is at least about 5 times greater than a rate of diffusion barrier material etching; and
(iii) subsequently sputtering the metal from the target onto the semiconductor wafer to form a second layer of metal.

26. The apparatus of claim 25, wherein program instructions for selective resputtering comprise instructions for impinging on the substrate with argon and/or copper ions, wherein the energy of the impinging ions is less than about 200 eV, and wherein resputtering comprises sputter etching the first layer of metal at least in one location on the wafer at a net etch rate of at least about 2 Å/second.

27. The apparatus of claim 25, wherein program instructions for selective resputtering comprise instructions for providing a bias power of less than about 600 W to the wafer.

28. The apparatus of claim 25, wherein program instructions for selective resputtering comprise instructions for selectively sputter etching a seed layer material in the presence of exposed diffusion barrier material, without externally biasing the wafer.

29. The apparatus of claim 25, wherein program instructions for selective resputtering comprise instructions for selectively removing seed layer material within a recessed feature, while simultaneously depositing seed layer material in the field region, wherein an etch rate to deposition rate ratio in the field region is less than 1.

30. The apparatus of claim 25, wherein program instructions further comprise:
sputter etching the first layer of metal prior to (ii) with ions of higher energy than ions used for resputtering in (ii).

31. The apparatus of claim 30, wherein program instructions further comprise instructions for repeating sputter etching the first layer of metal with higher energy ions and operation (ii) at least once.

32. The apparatus of claim 25, wherein program instructions for (ii) comprise instructions for selectively etching copper or copper alloy in the presence of diffusion barrier comprising tantalum.

* * * * *